US012684769B2

(12) United States Patent　　　(10) Patent No.:　US 12,684,769 B2
Kobayashi　　　　　　　　　　　　(45) Date of Patent:　Jul. 14, 2026

(54) SEMICONDUCTOR STORAGE DEVICE

(71) Applicant: Kioxia Corporation, Tokyo (JP)

(72) Inventor: Yusuke Kobayashi, Kuwana (JP)

(73) Assignee: KIOXIA CORPORATION, Tokyo (JP)

( * ) Notice: Subject to any disclaimer, the term of this patent is extended or adjusted under 35 U.S.C. 154(b) by 915 days.

(21) Appl. No.: 17/686,942

(22) Filed: Mar. 4, 2022

(65) Prior Publication Data

US 2023/0092696 A1　　　Mar. 23, 2023

(30) Foreign Application Priority Data

Sep. 21, 2021　　(JP) ................................. 2021-153514

(51) Int. Cl.
H10B 43/27　　　　(2023.01)
H10B 41/27　　　　(2023.01)
(52) U.S. Cl.
CPC ............. H10B 43/27 (2023.02); H10B 41/27 (2023.02)
(58) Field of Classification Search
CPC ........ H10B 43/27; H10B 41/27; H10B 43/10; H10B 41/10
See application file for complete search history.

(56) References Cited

U.S. PATENT DOCUMENTS

| | | |
|---|---|---|
| 2017/0256316 A1 | 9/2017 | Maejima |
| 2019/0287997 A1* | 9/2019 | Komiya .................... G11C 7/18 |
| 2021/0057445 A1 | 2/2021 | Kim et al. |
| 2021/0242072 A1 | 8/2021 | Lai et al. |
| 2021/0242234 A1 | 8/2021 | Lee |
| 2021/0280600 A1 | 9/2021 | Iguchi |
| 2021/0398997 A1* | 12/2021 | Luo ........................ H10B 43/50 |

FOREIGN PATENT DOCUMENTS

| | | |
|---|---|---|
| CN | 112420723 A | 2/2021 |
| CN | 113206104 A | 8/2021 |
| CN | 113380819 A1 | 9/2021 |
| JP | 6581019 B2 | 9/2019 |
| TW | 202131496 A | 8/2021 |

* cited by examiner

*Primary Examiner* — Calvin Y Choi
(74) *Attorney, Agent, or Firm* — Foley & Lardner LLP

(57)　　　　　　ABSTRACT

A semiconductor storage device includes conductive layers and inter-layer insulating layers alternately arranged over a substrate having a first region and a second region arranged in a first direction; and a first structure provided in a second region of the substrate. The first structure includes: a plurality of third regions provided at first positions corresponding to at least some of the plurality of conductive layers, respectively, and a plurality of fourth regions provided at second positions corresponding to at least some of the plurality of inter-layer insulating layers, respectively. A first width of the plurality of third regions in the first direction is greater than a second width of the plurality of fourth regions in the first direction.

5 Claims, 33 Drawing Sheets

SEMICONDUCTOR STORAGE DEVICE

CROSS-REFERENCE TO RELATED APPLICATION

This application is based upon and claims the benefit of priority from Japanese Patent Application No. 2021-153514, filed Sep. 21, 2021, the entire contents of which are incorporated herein by reference.

FIELD

Embodiments described herein relate generally to a semiconductor storage device.

BACKGROUND

A semiconductor storage device generally includes a substrate, a plurality of gate electrodes, a semiconductor layer, and a gate insulating layer. The plurality of gate electrodes are stacked in a direction intersecting a surface of the substrate. The semiconductor layer faces the plurality of gate electrodes. The gate insulating layer is provided between the gate electrode and the semiconductor layer. The gate insulating layer includes, for example, an insulating charge storage layer made of silicon nitride ($Si_3N_4$) or the like, a conductive charge storage layer such as a floating gate, and the like.

DESCRIPTION OF THE DRAWINGS

FIG. 2 is a cross-sectional view schematically illustrating a partial configuration of the semiconductor storage device.

FIG. 3 is a plan view schematically illustrating a partial configuration of the semiconductor storage device.

FIG. 4 is a cross-sectional view schematically illustrating a partial configuration of the semiconductor storage device.

FIG. 5 is a cross-sectional view schematically illustrating a partial configuration of the semiconductor storage device.

FIG. 10 is a cross-sectional view schematically illustrating the manufacturing method.

FIG. 11 is a cross-sectional view schematically illustrating the manufacturing method.

Figures 12, 13:
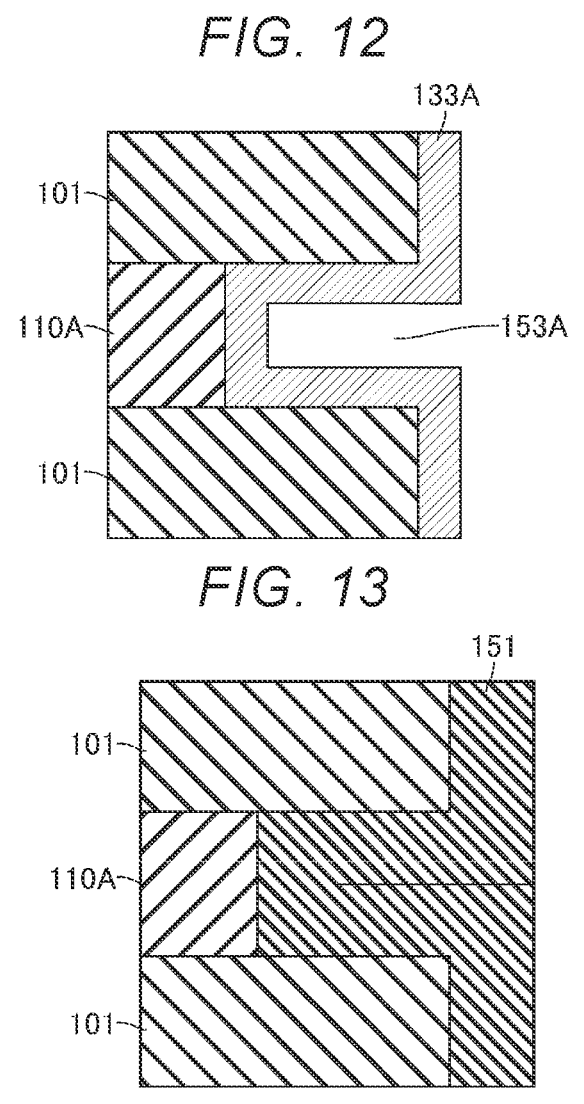

FIG. 12 is a cross-sectional view schematically illustrating the manufacturing method.

FIG. 13 is a cross-sectional view schematically illustrating the manufacturing method.

FIG. 23 is a cross-sectional view schematically illustrating the manufacturing method.

FIG. 24 is a cross-sectional view schematically illustrating the manufacturing method.

FIG. 34 is a cross-sectional view schematically illustrating a semiconductor storage device according to another embodiment.

DETAILED DESCRIPTION

Figure 1:
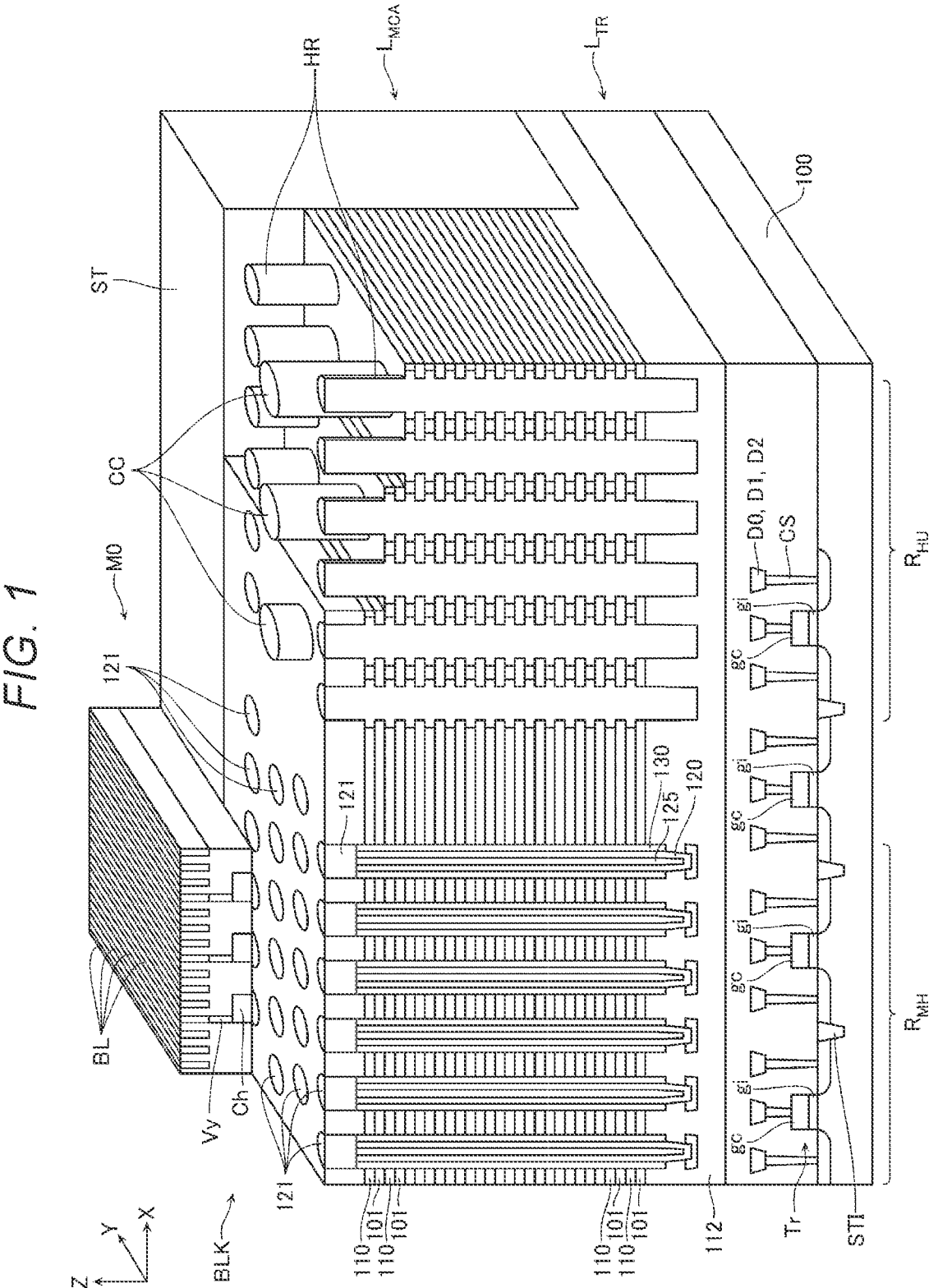
FIG. 1 is a perspective view schematically illustrating a semiconductor storage device according to an embodiment.

Embodiments provide a semiconductor storage device that can be suitably manufactured.

In general, according to one embodiment, a semiconductor storage device includes a substrate including a first region and a second region arranged in a first direction; a plurality of conductive layers and a plurality of inter-layer insulating layers alternately arranged in a second direction intersecting a surface of the substrate, wherein the plurality of conductive layers and the plurality of inter-layer insulating layers each extend in the first direction over the first region and the second region; a semiconductor layer provided in the first region, extending in the second direction, and facing the plurality of conductive layers; a charge storage film provided between the plurality of conductive layers and the semiconductor layer; and a first structure provided in the second region and extending in the second direction. The first structure includes: a plurality of third regions provided at first positions corresponding to at least some of the plurality of conductive layers, respectively, and a plurality of fourth regions provided at second positions corresponding to at least some of the plurality of inter-layer insulating layers, respectively. A first width of the plurality of third regions in the first direction is greater than a second width of the plurality of fourth regions in the first direction.

Then, a semiconductor storage device according to embodiments will be described in detail with reference to the drawings. The following embodiments are merely examples, and are not intended to limit the present disclosure. The following drawings are schematic, and some configurations and the like may be omitted for the sake of convenience in description. Common portions in a plurality of embodiments are denoted by the same reference signs, and repetitive description thereof may be omitted.

The term "semiconductor storage device" used in the present specification may mean a memory die, or mean a memory system including a controller die such as a memory chip, a memory card, or a solid state drive (SSD). The term "semiconductor storage device" may mean a configuration including a host computer such as a smartphone, a tablet terminal, and a personal computer.

The term "control circuit" used in the present specification may mean a peripheral circuit such as a sequencer provided on a memory die, may mean, for example, a controller die or a controller chip connected to the memory die, or may mean a configuration that includes both the meanings.

In the present specification, when a first component is said to be "electrically connected" to a second component, the first component may be directly connected to the second component, or the first component may be connected to the second component via a wiring, a semiconductor member, a transistor, or the like. For example, when three transistors are connected in series, the first transistor is "electrically connected" to the third transistor even though the second transistor is in an OFF state.

In the present specification, a predetermined direction parallel to an upper surface of a substrate is referred to as an X direction, a direction which is parallel to the upper surface of the substrate and is perpendicular to the X direction is referred to as a Y direction, and a direction perpendicular to the upper surface of the substrate is referred to as a Z direction.

In the present specification, a direction along a predetermined surface is referred to as a first direction, a direction intersecting the first direction along the predetermined surface is referred to as a second direction, and a direction intersecting the predetermined surface is referred to as a third direction. The first direction, the second direction, and the third direction may or may not correspond to any of the X direction, the Y direction, and the Z direction.

In the present specification, expressions such as "up" and "down" are based on the substrate. For example, a direction away from the substrate along the Z direction is referred to as up, and a direction toward the substrate along the Z direction is referred to as down. Further, when referring to a lower surface or a lower end of a certain component, it means a surface or an end portion on the substrate side of this component. When referring to an upper surface or an upper end, it means a surface or an end portion of this component on an opposite side of the substrate. A surface intersecting the X direction or the Y direction is referred to as a side surface or the like.

Further, in the present specification, when referring to a "width", a "length", a "thickness", or the like in a predetermined direction for a component, a member, and the like, this means the width, the length, the thickness, or the like in a cross section or the like observed by scanning electron microscopy (SEM), transmission electron microscopy (TEM), or the like.

4

Embodiment

Configuration

Figure 2:
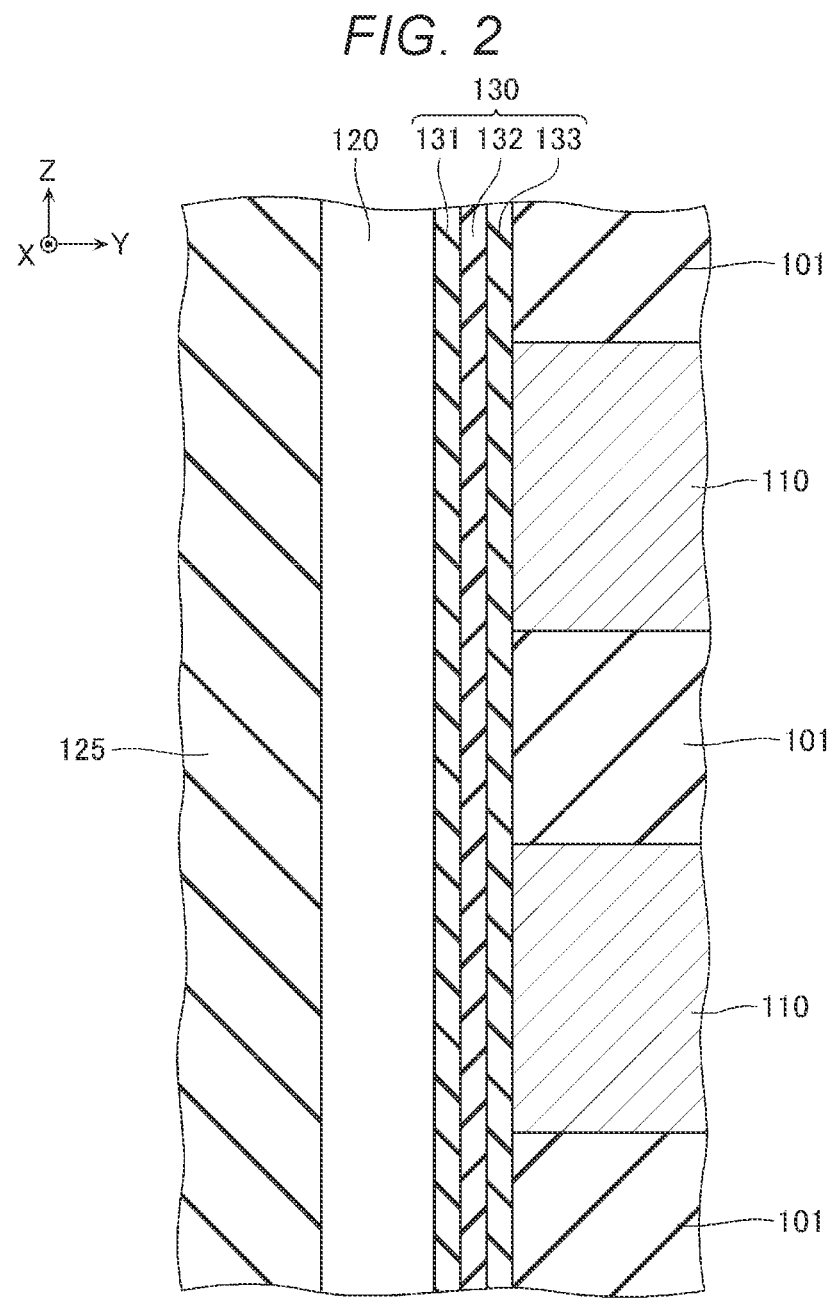
Figure 3:
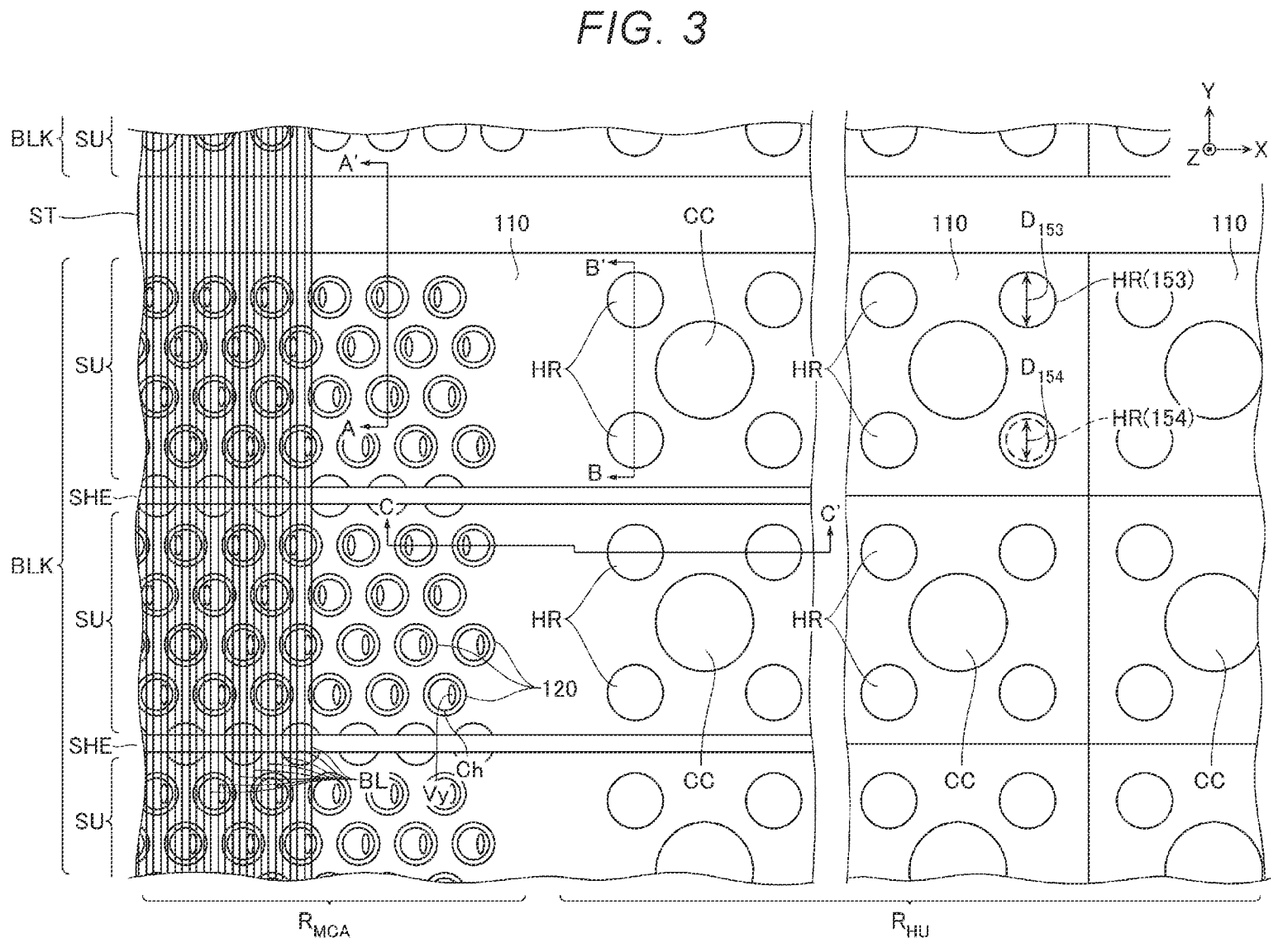
Figure 4:
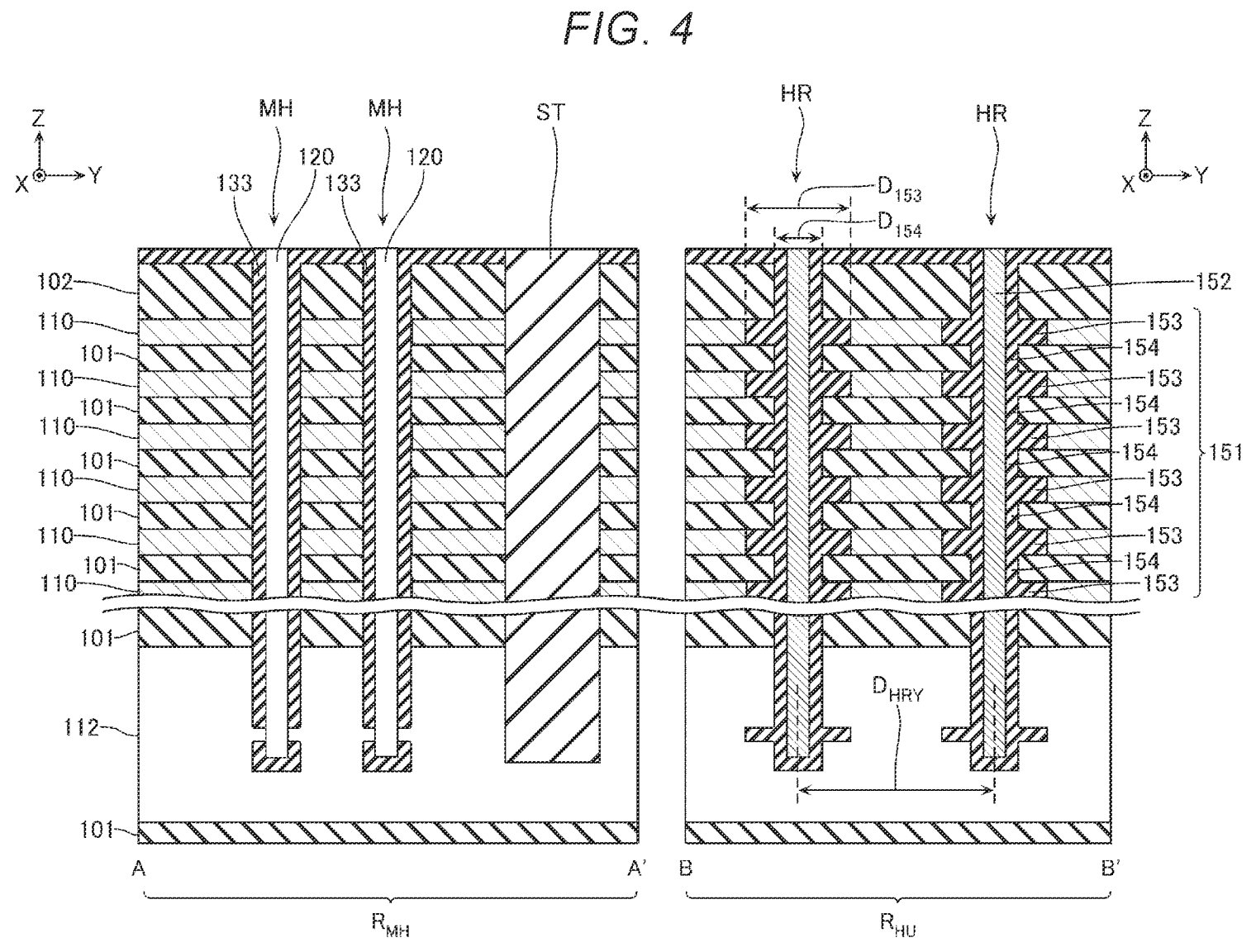
Figure 5:
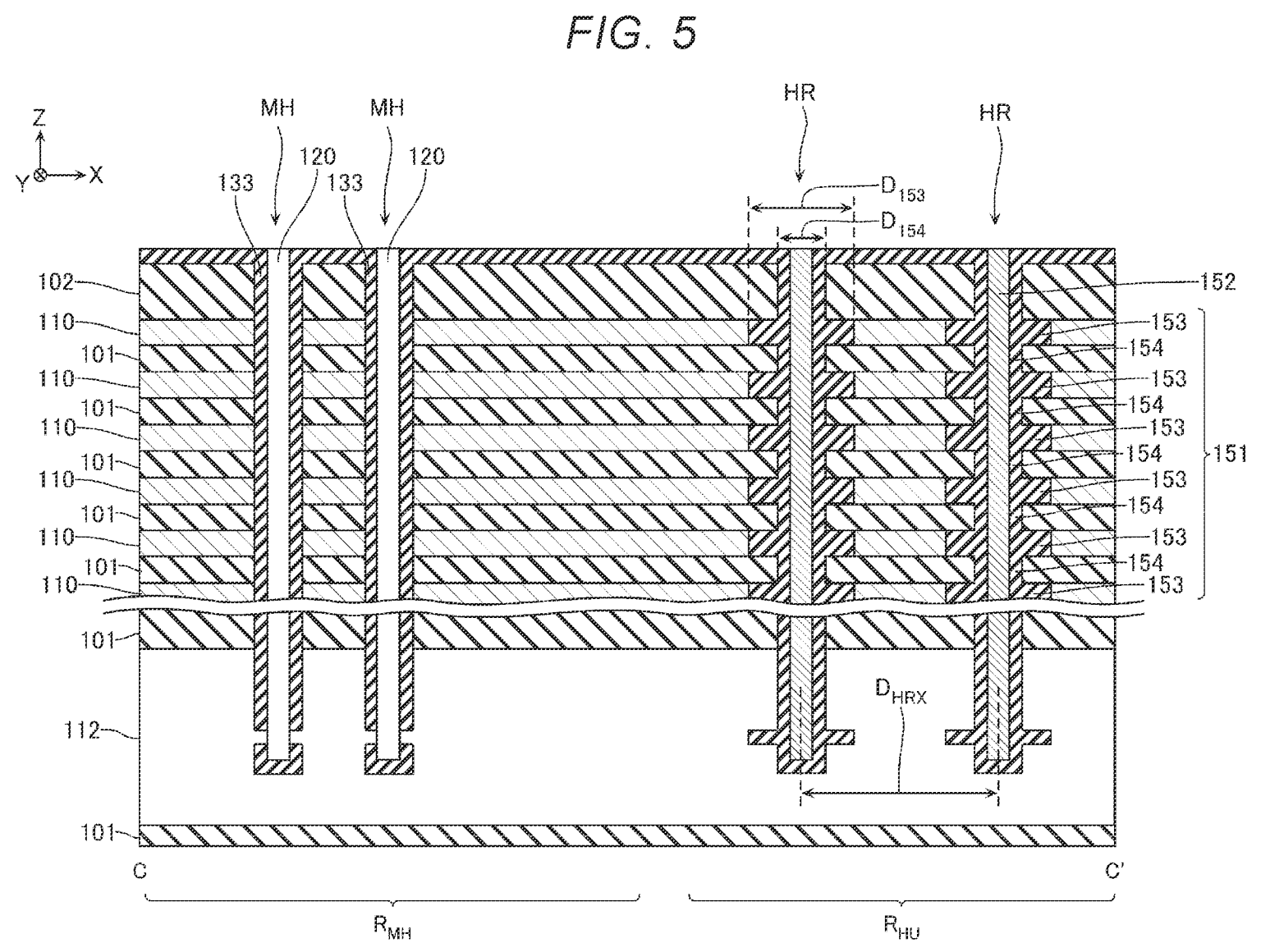

FIG. 1 is a perspective view schematically illustrating a semiconductor storage device according to an embodiment. FIG. 2 is a cross-sectional view schematically illustrating a partial configuration of the semiconductor storage device. Although FIG. 2 illustrates a YZ cross section, a structure similar to that in FIG. 2 is observed even when a cross section other than the YZ cross section (for example, an XZ cross section) along the central axis of a semiconductor layer 120 is observed. FIG. 3 is a plan view schematically illustrating a partial configuration of the semiconductor storage device. FIGS. 4 and 5 are cross-sectional views schematically illustrating a partial configuration of the semiconductor storage device. FIG. 4 illustrates a cross section that is obtained by taking the structure illustrated in FIG. 3 along line A-A' and is viewed along a direction indicated by an arrow. Further, FIG. 4 illustrates a cross section that is obtained by taking the structure illustrated in FIG. 3 along line B-B' and is viewed along a direction indicated by an arrow. FIG. 5 illustrates a cross section that is obtained by taking the structure illustrated in FIG. 3 along line C-C and is viewed along a direction indicated by an arrow. In FIGS. 4 and 5, illustrations of an insulating layer 125, a tunnel insulating film 131, and a charge storage film 132, which will be described later, are omitted.

As illustrated in FIG. 1, a semiconductor storage device includes a semiconductor substrate 100, a transistor layer $L_{TR}$ provided on the semiconductor substrate 100, wiring layers DO to D2 provided above the transistor layer $L_{TR}$, a memory cell array layer $L_{MCA}$ provided above the wiring layer D2, and a wiring layer MO provided above the memory cell array layer $L_{MCA}$.

Structure of Semiconductor Substrate 100

The semiconductor substrate 100 contains P-type silicon (Si) containing P-type impurities such as boron (B), for example. An N-type well region containing N-type impurities such as phosphorus (P), a P-type well region containing P-type impurities such as boron (B), a semiconductor substrate region in which the N-type well region and the P-type well region are not provided, and an insulating region STI are provided on the surface of the semiconductor substrate 100.

A memory hole region $R_{MH}$ and a hookup region $R_{HU}$, that are arranged in the X direction, are provided in the semiconductor substrate 100.

Structure of Transistor Layer $L_{TR}$

The transistor layer $L_{TR}$ includes a plurality of insulating layers gi provided on the upper surface of the semiconductor substrate 100, and a plurality of electrodes gc provided on the upper surfaces of the plurality of insulating layers gi. The regions of the semiconductor substrate 100 and the plurality of electrodes gc are connected to contact electrodes CS, respectively.

The N-type well region, the P-type well region, and the semiconductor substrate region of the semiconductor substrate 100 function as channel regions of a plurality of transistors Tr constituting a peripheral circuit of a NAND flash memory, one electrodes of a plurality of capacitors, and the like.

The plurality of electrodes gc functions as gate electrodes of the plurality of transistors Tr constituting the peripheral circuit of the NAND flash memory, the other electrodes of the plurality of capacitors, and the like.

The contact electrode CS extends in the Z direction and is connected to the upper surface of the semiconductor substrate 100 or the upper surface of the electrode gc at the lower end of the contact electrode CS. An impurity region containing N-type impurities or P-type impurities is provided at a portion at which the contact electrode CS and the semiconductor substrate 100 are connected to each other. The contact electrode CS may include, for example, a stacked film of a barrier conductive film made of titanium nitride (TiN) or the like and a metal film made of tungsten (W) or the like.

Structure of Wiring Layers D0, D1, and D2

A plurality of wirings in the wiring layers D0, D1, and D2 are electrically connected to at least one of the components in the transistor layer $L_{TR}$ and the components in the memory cell array layer $L_{MCA}$. The plurality of wirings may include, for example, a stacked film of a barrier conductive film made of titanium nitride (TiN) or the like and a metal film made of tungsten (W) or the like.

Structure of Memory Cell Array Layer $L_{MCA}$ in Memory Hole Region $R_{MH}$

A memory block BLK is provided in the memory cell array layer $L_{MCA}$. An inter-block insulating layer ST made of silicon oxide (SiO$_2$) or the like is provided on the side surface of the memory block BLK in the Y direction. For example, as illustrated in FIG. 3, the memory block BLK includes a plurality of string units SU arranged in the Y direction. An inter-string unit insulating layer SHE made of silicon oxide (SiO$_2$) or the like is provided between two string units SU adjacent to each other in the Y direction.

For example, as illustrated in FIG. 1, the memory block BLK includes a plurality of conductive layers 110 arranged in the Z direction, a plurality of semiconductor layers 120 extending in the Z direction, and a plurality of gate insulating films 130 respectively provided between the plurality of conductive layers 110 and the plurality of semiconductor layers 120.

The conductive layer 110 has a substantially plate-like shape extending in the X direction. The conductive layer 110 may include a stacked film of a barrier conductive film made of titanium nitride (TiN) or the like and a metal film made of tungsten (W) or the like. The conductive layer 110 may contain, for example, polycrystalline silicon containing impurities such as phosphorus (P) or boron (B). An inter-layer insulating layer 101 made of silicon oxide (SiO$_2$) or the like is provided between the plurality of conductive layers 110 arranged in the Z direction.

Some of the plurality of conductive layers 110 function as a gate electrode of a memory cell (memory transistor) of the NAND flash memory and a word line. Some of the plurality of conductive layers 110 function as a gate electrode of a select transistor of the NAND flash memory and a select gate line. Some of the plurality of conductive layers 110 are divided in the Y direction for each string unit SU by the inter-string unit insulating layer SHE illustrated in FIG. 3.

As illustrated in FIG. 1, a conductive layer 112 is provided below the conductive layer 110. The conductive layer 112 may contain, for example, polycrystalline silicon containing impurities such as phosphorus (P) or boron (B). The conductive layer 112 may include, for example, a metal layer made of tungsten (W) or the like, a conductive layer made of tungsten silicide or the like, or other conductive layers. The inter-layer insulating layer 101 made of silicon oxide (SiO$_2$) or the like is provided between the conductive layer 112 and the conductive layer 110. The conductive layer 112 functions as a source line of the NAND flash memory.

For example, as illustrated in FIG. 3, the semiconductor layers 120 are arranged in the X direction and the Y direction in a predetermined pattern. The semiconductor layer 120 functions as a memory cell of the NAND flash memory and a channel region of the select transistor. The semiconductor layer 120 contains, for example, polycrystalline silicon (Si). For example, as illustrated in FIG. 1, the semiconductor layer 120 has a substantially cylindrical shape, and an insulating layer 125 made of silicon oxide or the like is provided at the central portion of the semiconductor layer 120. An outer peripheral surface of each of the semiconductor layers 120 is surrounded by the conductive layer 110 and faces the conductive layer 110.

An impurity region 121 containing N-type impurities such as phosphorus (P) is provided at an upper end portion of the semiconductor layer 120. The impurity region 121 is connected to a bit line BL via a contact electrode Ch and a contact electrode Vy.

The lower end portion of the semiconductor layer 120 is connected to the conductive layer 112.

The gate insulating film 130 has a substantially cylindrical shape that covers the outer peripheral surface of the semiconductor layer 120. For example, as illustrated in FIG. 2, the gate insulating film 130 includes a tunnel insulating film 131, a charge storage film 132, and a block insulating film 133, which are stacked between the semiconductor layer 120 and the conductive layer 110. The tunnel insulating film 131 and the block insulating film 133 contain, for example, silicon oxide (SiO$_2$). The charge storage film 132 includes, for example, a film that is made of silicon nitride (Si$_3$N$_4$) or the like and is capable of storing charges. The tunnel insulating film 131, the charge storage film 132, and the block insulating film 133 have a substantially cylindrical shape, and extend in the Z direction along the outer peripheral surface of the semiconductor layer 120 except for a contact portion between the semiconductor layer 120 and the conductive layer 112.

FIG. 2 illustrates an example in which the gate insulating film 130 includes the charge storage film 132 made of silicon nitride or the like. Alternatively, the gate insulating film 130 may include, for example, a floating gate made of polycrystalline silicon containing N-type or P-type impurities.

Structure of Memory Cell Array Layer $L_{MCA}$ in Hookup Region $R_{HU}$

As illustrated in FIGS. 1 and 3, the hookup region $R_{HU}$ includes a plurality of contact electrodes CC and a plurality of support structures HR provided near the plurality of contact electrodes CC.

FIG. 1 illustrates a plurality of contact electrodes CC arranged in the X direction. The plurality of contact electrodes CC extend in the Z direction and are connected to a plurality of conductive layers 110 having different height positions at the lower ends of the contact electrodes. The contact electrode CC may include, for example, a stacked film of a barrier conductive film made of titanium nitride (TiN) or the like and a metal film made of tungsten (W) or the like.

The support structure HR has a substantially columnar shape extending in the Z direction. The outer peripheral surface of the support structure HR is surrounded by the conductive layer 110 and the inter-layer insulating layer 101, and is in contact with the conductive layer 110 and the inter-layer insulating layer 101.

Further, as illustrated in FIGS. 4 and 5, the support structure HR includes an insulating layer 151 having a substantially cylindrical shape and an insulating layer 152 having an outer peripheral surface that is covered with the insulating layer 151. The insulating layer 151 includes a plurality of regions 153 and a plurality of regions 154. The plurality of regions 153 are provided at positions corresponding to the plurality of conductive layers 110 arranged in the Z direction, respectively. The plurality of regions 154 are provided at positions corresponding to the plurality of inter-layer insulating layers 101 arranged in the Z direction, respectively. The plurality of regions 153 and the plurality of regions 154 are arranged alternately in the Z direction. The outer diameter $D_{153}$ of the region 153 is greater than the outer diameter $D_{154}$ of the region 154. A portion of the upper surface of the region 153 is in contact with the lower surface of the inter-layer insulating layer 101. A portion of the lower surface of the region 153 is in contact with the upper surface of the inter-layer insulating layer 101. The outer peripheral surface of the region 153 is in contact with the conductive layer 110. The outer peripheral surface of the region 154 is in contact with the inter-layer insulating layer 101.

The outer diameter $D_{153}$ of the region 153 can be defined by, for example, a method as follows. For example, an XY cross section corresponding to any of the plurality of conductive layers 110 arranged in the Z direction is observed by SEM, TEM, or the like (see FIG. 3). Then, in this XY cross section, a circle is fitted along the outer peripheral surface of the region 153. The diameter of this circle may be used as the outer diameter $D_{153}$.

Similarly, the outer diameter $D_{154}$ of the region 154 may be defined by, for example, a method as follows. For example, an XY cross section corresponding to any of the plurality of inter-layer insulating layers 101 arranged in the Z direction is observed by SEM, TEM, or the like (see FIG. 3). Then, in this XY cross section, a circle is fitted along the outer peripheral surface of the region 154. The diameter of this circle may be used as the outer diameter $D_{154}$.

When the outer diameters $D_{153}$ and $D_{154}$ are defined by such a method, the height positions of the two XY cross sections corresponding to the regions 153 and 154 are desirably close to each other. For example, when the outer diameter $D_{133}$ is defined based on the XY cross section corresponding to any of two conductive layers 110 adjacent to each other in the Z direction, the outer diameter $D_{154}$ is desirably defined based on the XY cross section corresponding to the inter-layer insulating layer 101 provided between the two conductive layers 110. The outer diameters $D_{153}$ and $D_{154}$ may be defined based on the XY cross section corresponding to other height positions.

FIG. 4 illustrates a distance $D_{HRY}$ between the central positions of two support structures HR adjacent to each other in the Y direction in the Y direction. FIG. 5 illustrates a distance $D_{HRX}$ between the central positions of two support structures HR adjacent to each other in the X direction. The protrusion amount of the region 153 from the region 154 (the half of a difference between the outer diameter $D_{153}$ and the outer diameter $D_{154}$) can be adjusted as appropriate. For example, the protrusion amount may be greater than $\frac{1}{16}$ of the distance $D_{HRY}$, the distance $D_{HRX}$, or the smaller of the distance $D_{HRY}$ and the distance $D_{HRX}$.

The inter-layer insulating layer 101 and the insulating layers 151 and 152 may contain, for example, silicon oxide ($SiO_2$). The density of the insulating layer 151 may be greater than the densities of the inter-layer insulating layer 101 and the insulating layer 152. The content of hydrogen (H) or other impurities in the insulating layer 151 may be smaller than the contents of impurities in the inter-layer insulating layer 101 and the insulating layer 152. The etching rates of the inter-layer insulating layer 101 and the insulating layer 152 for hydrofluoric acid or other chemical solutions may be greater than the etching rate of the insulating layer 151. The inter-layer insulating layer 101 and the insulating layers 151 and 152 may be distinguishable by transmission electron microscope (TEM) or the like. The boundary line between the inter-layer insulating layer 101 and the insulating layers 151 and 152 may be distinguishable by transmission electron microscope or the like.

Structure of Wiring Layer M0

For example, as illustrated in FIG. 1, the wiring layer M0 includes a plurality of wirings. The plurality of wirings may include, for example, a stacked film of a barrier conductive film made of titanium nitride (TiN) or the like and a metal film made of copper (Cu) or the like. Some of the plurality of wirings function as the bit lines BL. The bit lines BL are aligned in the X direction and extend in the Y direction. Each of the plurality of bit lines BL is connected to the semiconductor layer 120 via the contact electrodes Ch and Vy.

Manufacturing Method

Figures 14, 15:
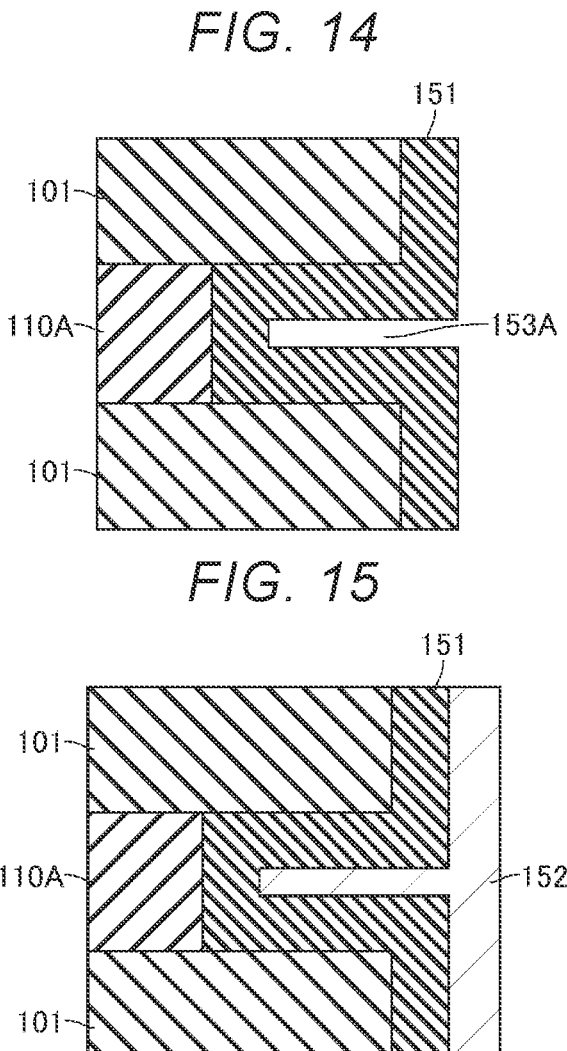
FIG. 14 is a cross-sectional view schematically illustrating the manufacturing method.
FIG. 15 is a cross-sectional view schematically illustrating the manufacturing method.

Next, a manufacturing method of the semiconductor storage device according to the embodiment will be described with reference to FIGS. 6 to 30. FIGS. 6 to 11 and 16 to 24 are cross-sectional views schematically illustrating the manufacturing method, and illustrate a cross section corresponding to FIG. 4. FIG. 12 is a cross-sectional view schematically illustrating the manufacturing method, and illustrates a portion indicated by A in FIG. 10 in an enlarged manner. FIG. 13 is a cross-sectional view schematically illustrating the manufacturing method, and illustrates a portion indicated by A in FIG. 11 in an enlarged manner. FIG. 14 is a cross-sectional view schematically illustrating another performing method of the manufacturing method, and illustrates a portion indicated by A in FIG. 11 in an enlarged manner. FIG. 15 is a cross-sectional view schematically illustrating another performing method of the manufacturing method, and illustrates a portion corresponding to FIG. 14. FIGS. 25 to 30 are cross-sectional views schematically illustrating the manufacturing method, and illustrate a cross section corresponding to FIG. 4.

In manufacturing the semiconductor storage device according to the embodiment, first, a transistor layer LTR and wiring layers D0 to D2 (FIG. 1) are formed on a semiconductor substrate 100. An inter-layer insulating layer 101 is formed above the wiring layer D2.

Figure 6:
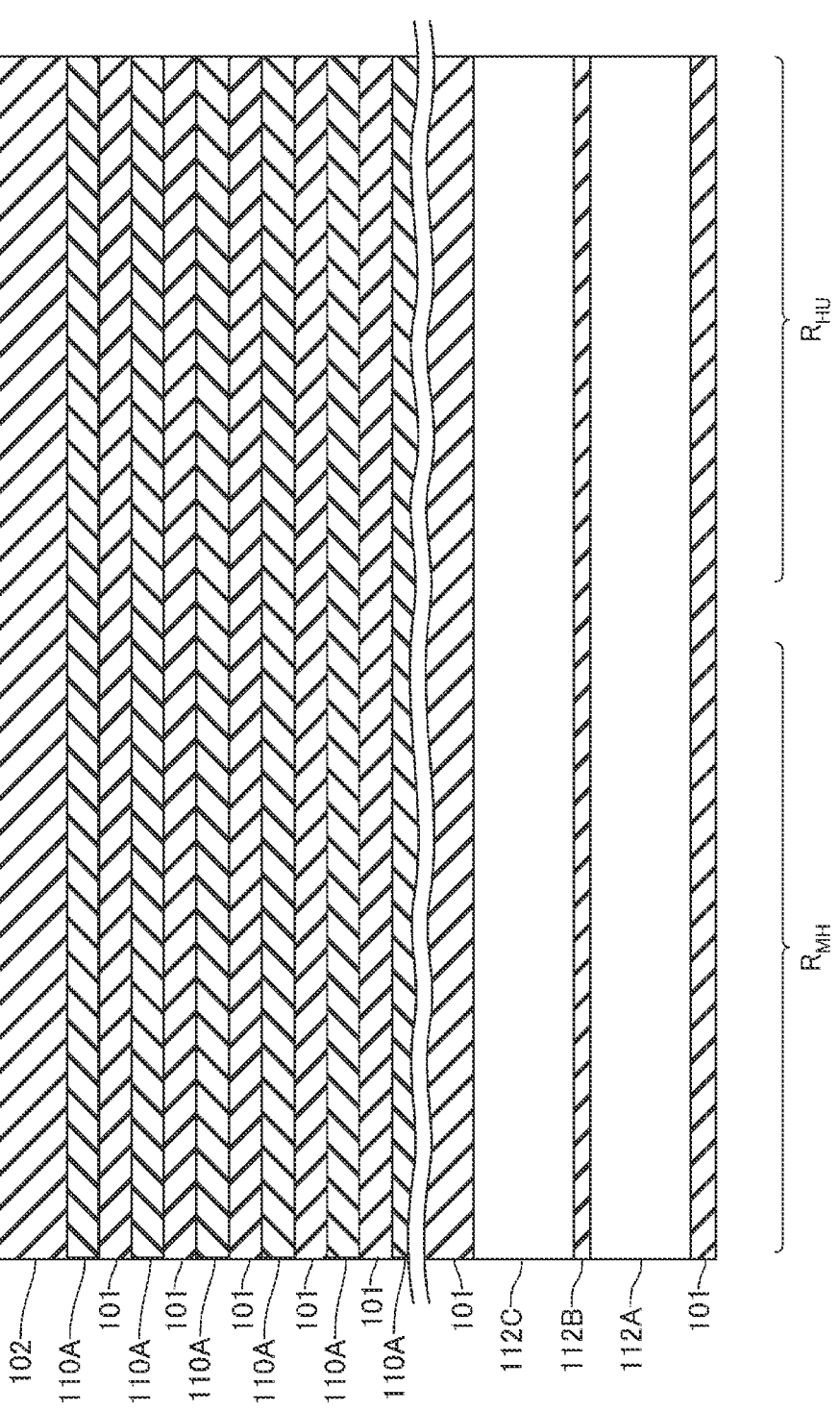
FIG. 6 is a cross-sectional view schematically illustrating a manufacturing method of a semiconductor storage device according to the embodiment.

Then, for example, as illustrated in FIG. 6, a semiconductor layer 112A made of silicon, a sacrificial layer 112B made of silicon nitride, and a semiconductor layer 112C made of silicon are formed. A plurality of inter-layer insulating layers 101 and a plurality of sacrificial layers 110A are alternately formed. The insulating layer 102 is formed. This step is performed by, for example, a method such as chemical vapor deposition (CVD).

Figure 7:
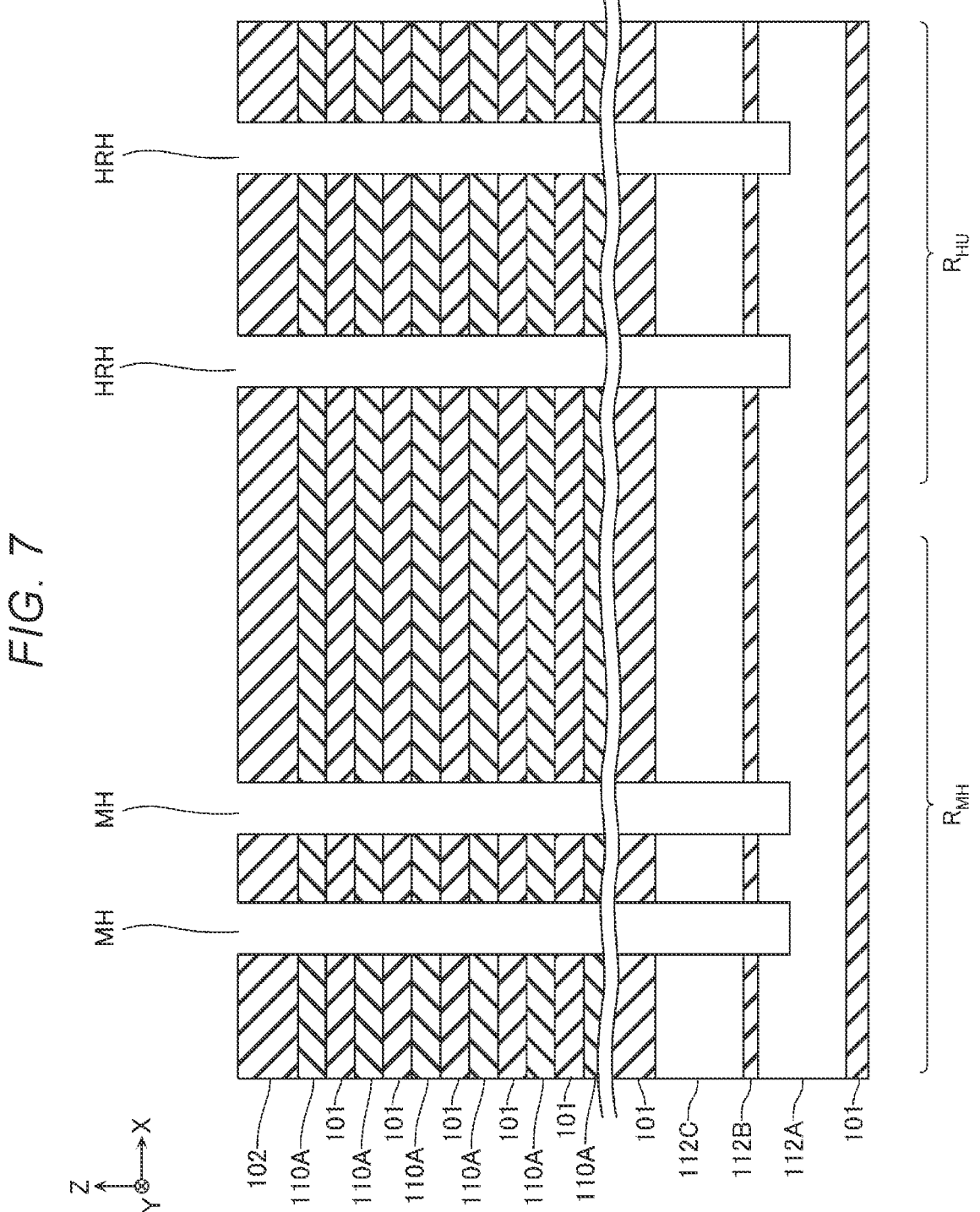
FIG. 7 is a cross-sectional view schematically illustrating the manufacturing method.

Then, for example, as illustrated in FIG. 7, a plurality of memory holes MH are formed at positions corresponding to the plurality of semiconductor layers 120. A plurality of via holes HRH are formed at positions corresponding to the plurality of support structures HR. The memory hole MH and the via hole HRH are through-holes that extend in the Z direction, penetrate the inter-layer insulating layer 101, the sacrificial layer 110A, the semiconductor layer 112C, and the sacrificial layer 112B, and expose the upper surface of the semiconductor layer 112A. This step is performed by, for example, a method such as RIE.

Figure 8:
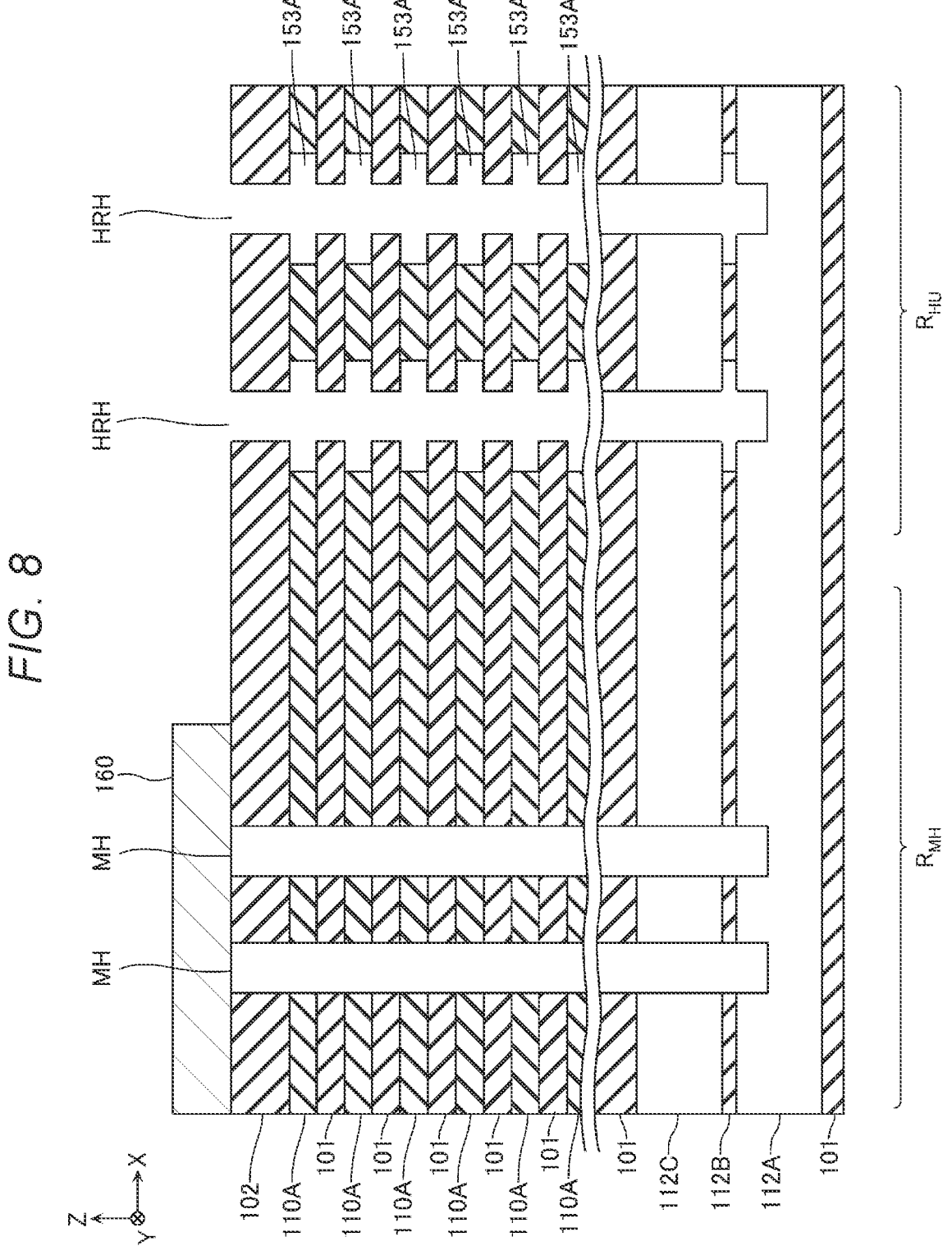
FIG. 8 is a cross-sectional view schematically illustrating the manufacturing method.

Then, for example, as illustrated in FIG. 8, a mask material 160 is formed on the upper surface of the insulating layer 102. The mask material 160 covers the plurality of memory holes MH and exposes the plurality of via holes HRH.

Then, as illustrated in FIG. 8, for example, a portion of the sacrificial layer 110A is removed through the plurality of via holes HRH to form a plurality of voids 153A. This step is performed, for example, by wet etching.

Figure 9:
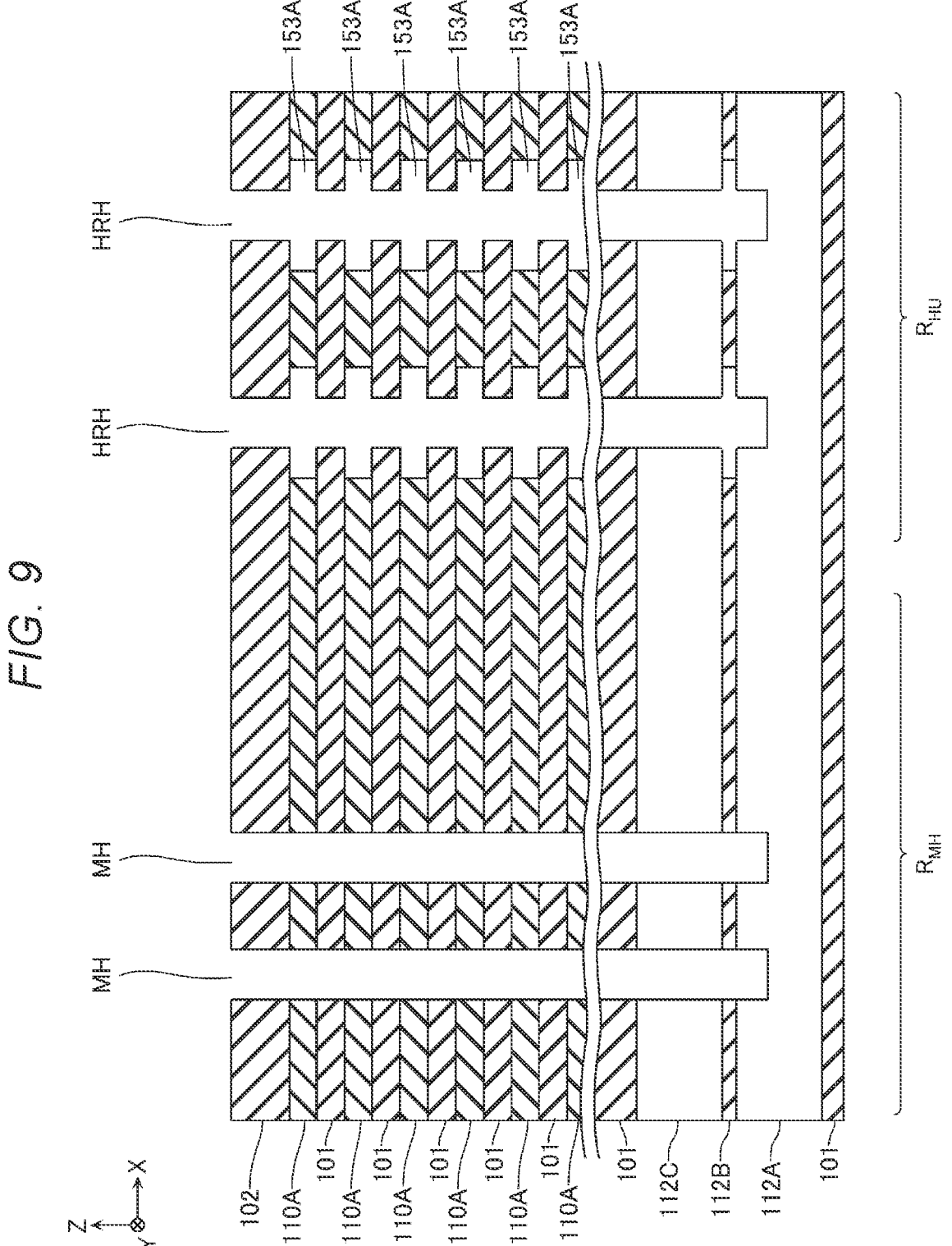
FIG. 9 is a cross-sectional view schematically illustrating the manufacturing method.

Then, for example, as illustrated in FIG. 9, the mask material 160 is removed.

Figure 10:
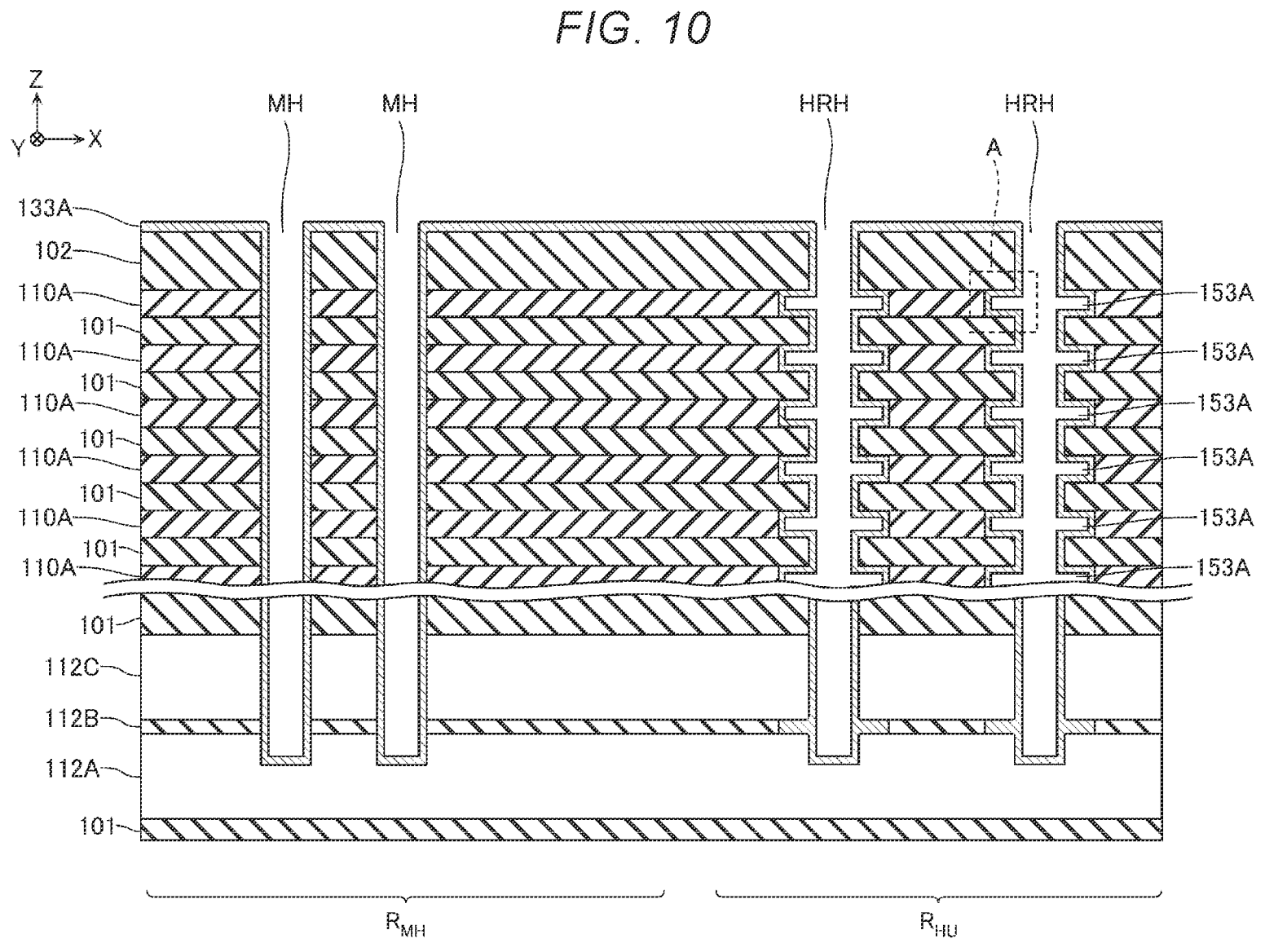

Then, for example, as illustrated in FIG. 10, an insulating layer 133A made of silicon nitride or the like is formed on the upper surface of the insulating layer 102, the inner peripheral surface of the memory hole MH, and the inner peripheral surface of the via hole HRH. This step is performed by, for example, CVD.

Figure 11:
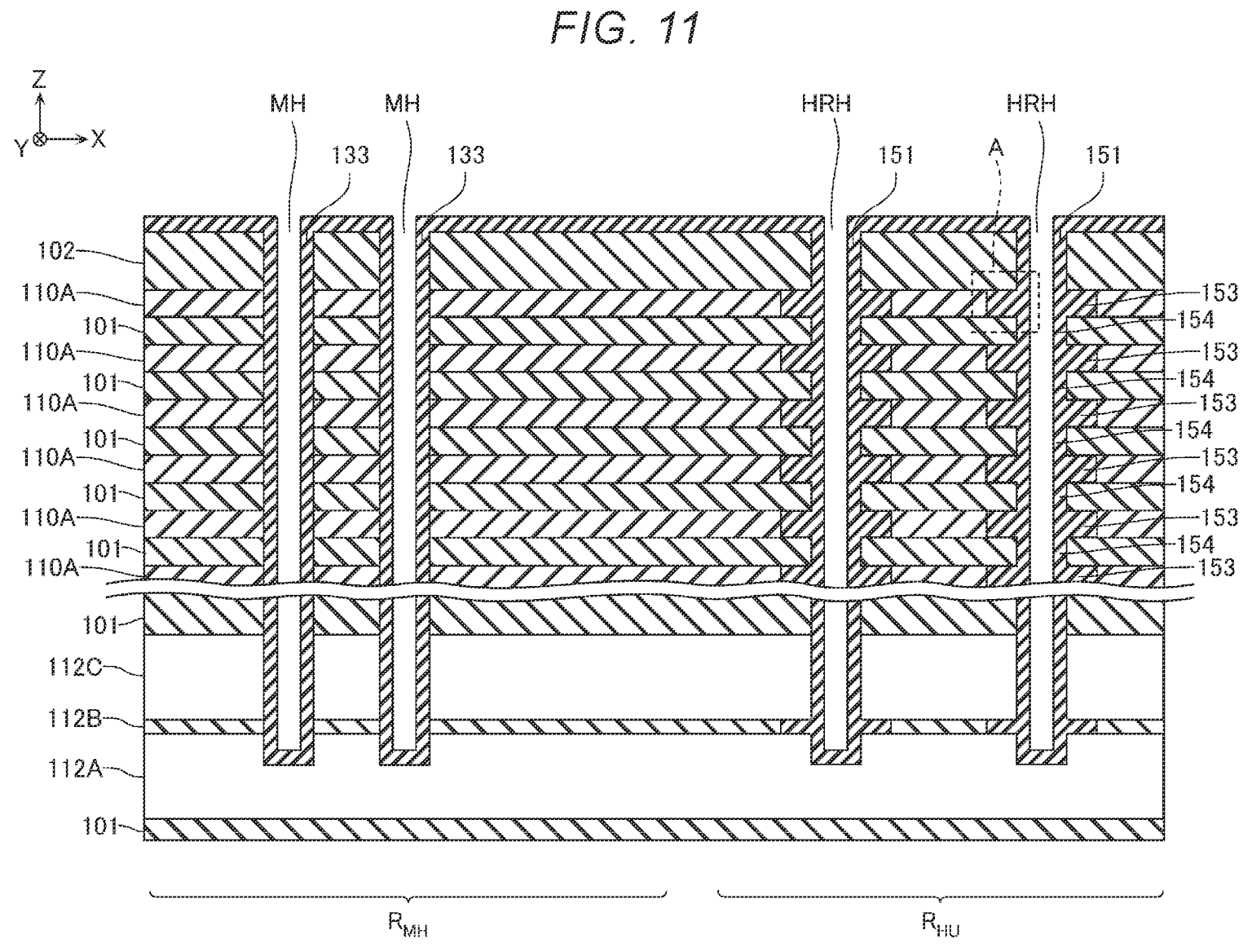

Then, for example, as illustrated in FIG. 11, an oxidation treatment is performed on the insulating layer 133A. Thus, a plurality of block insulating films 133 are formed in the plurality of memory holes MH. Further, a plurality of insulating layers 151 are formed in the plurality of via holes HRH.

For example, as illustrated in FIG. 12, the insulating layer 133A (FIG. 10) may have a film thickness causing the void 153A not to be buried. For example, the film thickness of the insulating layer 133A may be smaller than the half of the film thickness of the sacrificial layer 110A.

Here, as illustrated in FIG. 13, when an oxidation treatment is performed on the insulating layer 133A, the volume of the insulating layer 133A increases. That is, the volumes of the block insulating film 133 and the insulating layer 151 are larger than the volume of the insulating layer 133A. Thus, in this step, the void 153A may be buried by such an increase in volume.

Such a method is just an example, and a specific method can be adjusted as appropriate. For example, in the step described with reference to FIG. 11, the void 153A may not be buried, as illustrated in FIG. 14. In such a case, for example, as illustrated in FIG. 15, an insulating layer 152 may be formed in the via hole HRH in a step described later, thereby the void 153A may be buried.

Figure 16:
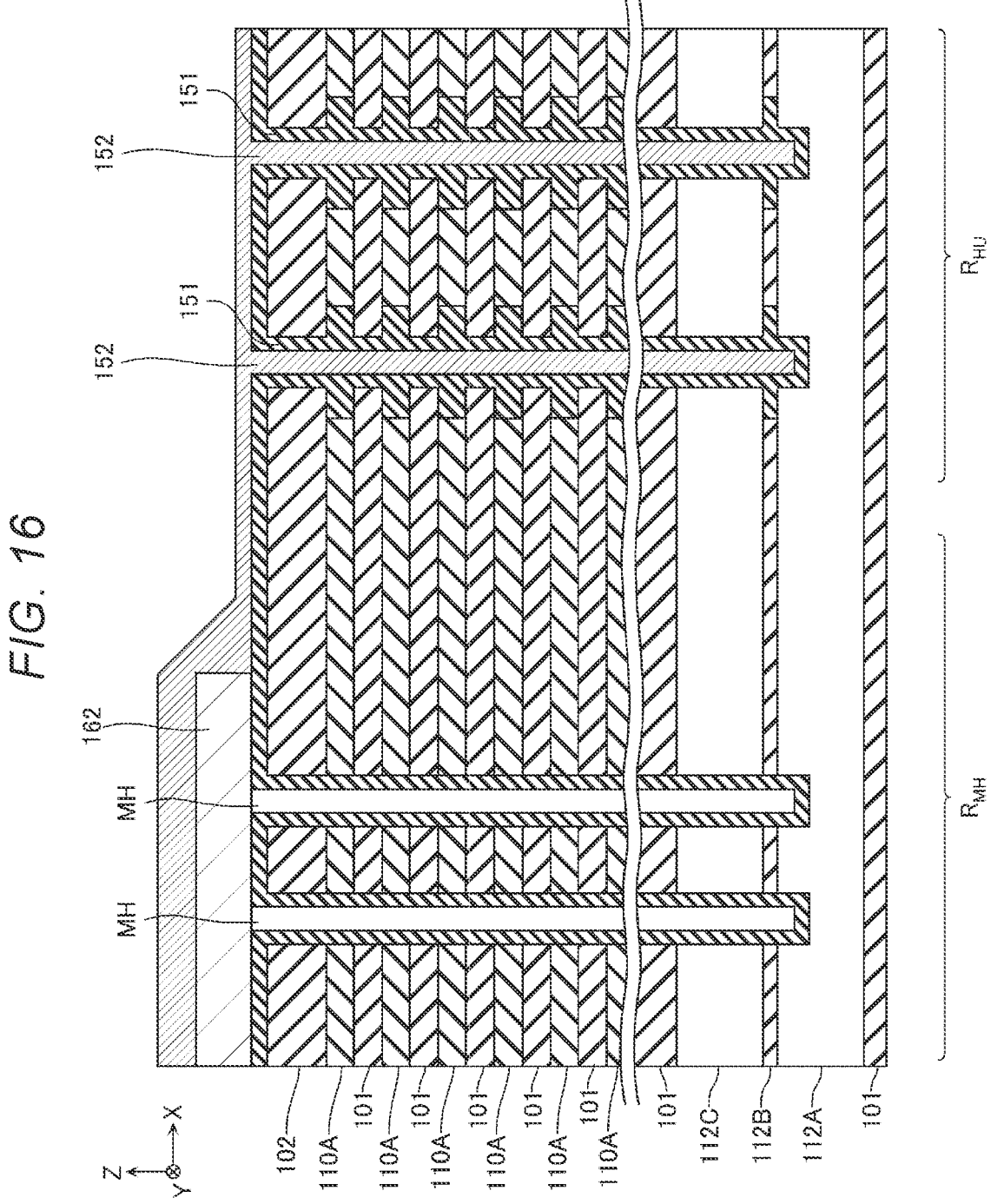
FIG. 16 is a cross-sectional view schematically illustrating the manufacturing method.

Then, for example, as illustrated in FIG. 16, a mask material 162 is formed on the upper surface of the insulating layer 102. The mask material 162 covers the plurality of memory holes MH and exposes the plurality of via holes HRH.

Then, as illustrated in FIG. 16, for example, the insulating layer 152 is formed in the plurality of via holes HRH. FIG. 16 illustrates an example of applying a material such as polysilazane. Alternatively, this step may be performed by CVD or the like. In this step, a step is formed on the upper surface of the insulating layer 152 between the memory hole region $R_{MH}$ and the hookup region $R_{HU}$.

Figure 17:
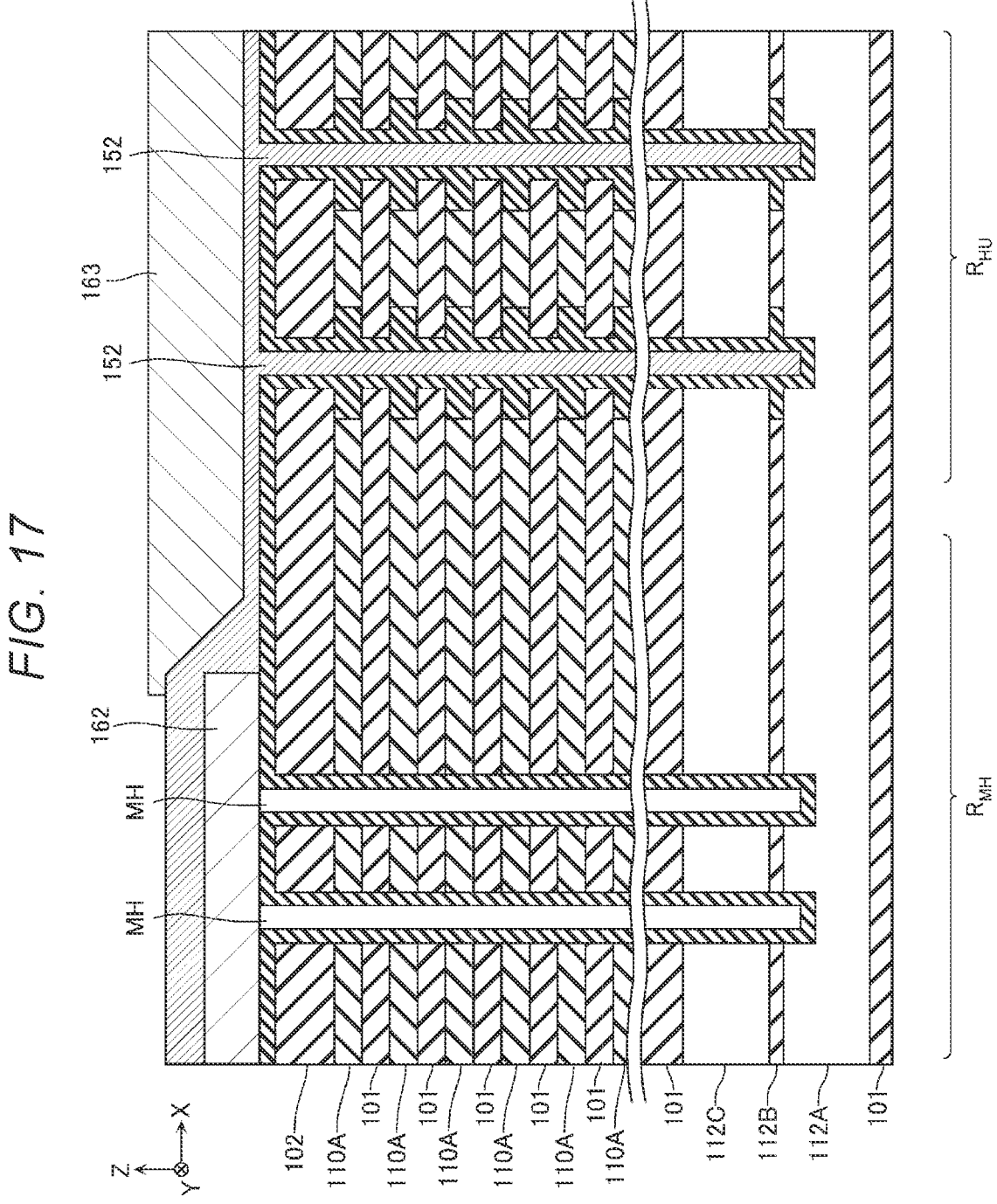
FIG. 17 is a cross-sectional view schematically illustrating the manufacturing method.

Then, for example, as illustrated in FIG. 17, in the hookup region $R_{HU}$, a mask material 163 is formed on the upper surface of the insulating layer 152.

Figure 18:
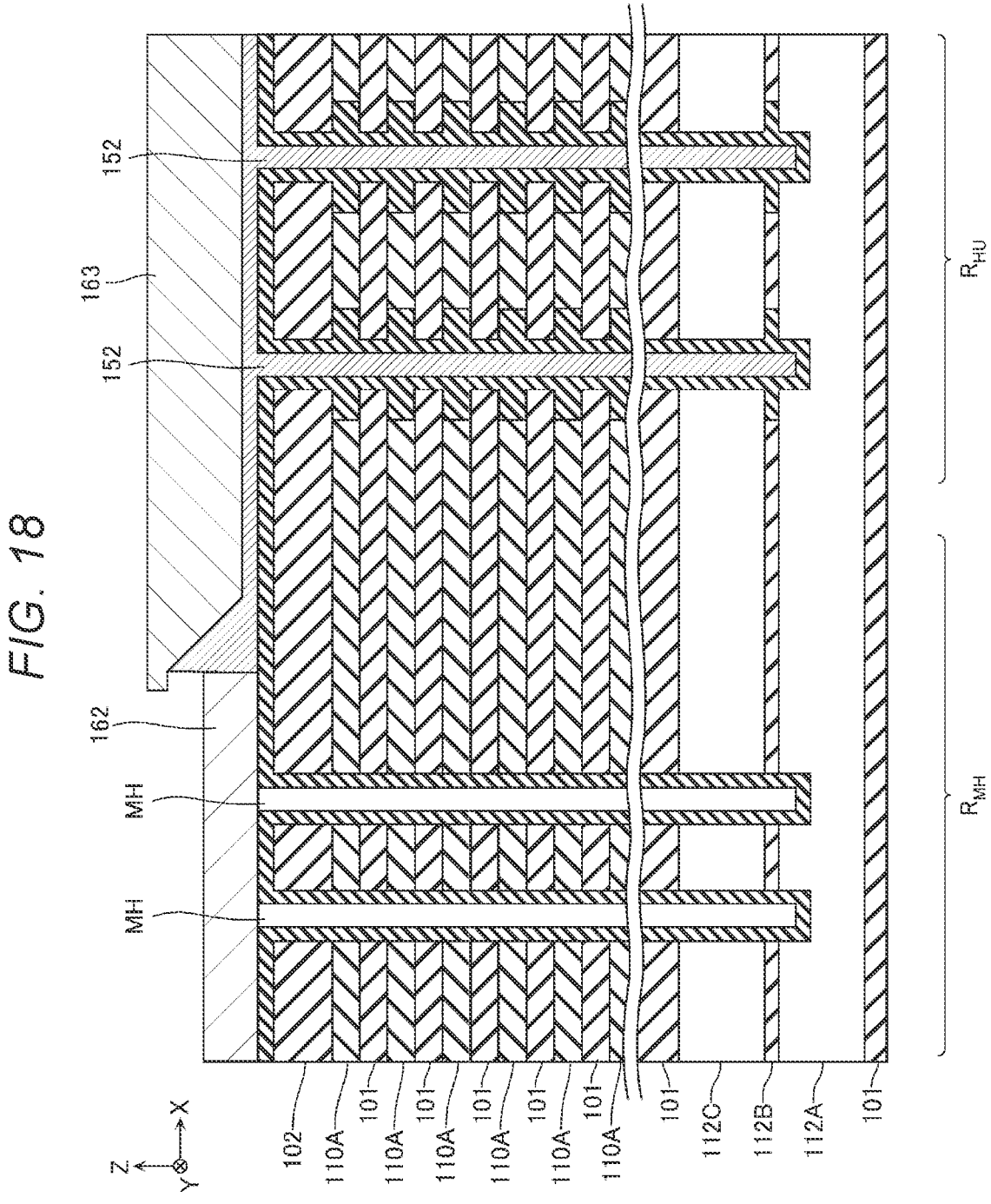
FIG. 18 is a cross-sectional view schematically illustrating the manufacturing method.

Then, for example, as illustrated in FIG. 18, the insulating layer 152 is removed in the memory hole region $R_{MH}$ to expose the upper surface of the mask material 162. This step is performed by, for example, dry etching or wet etching.

Figure 19:
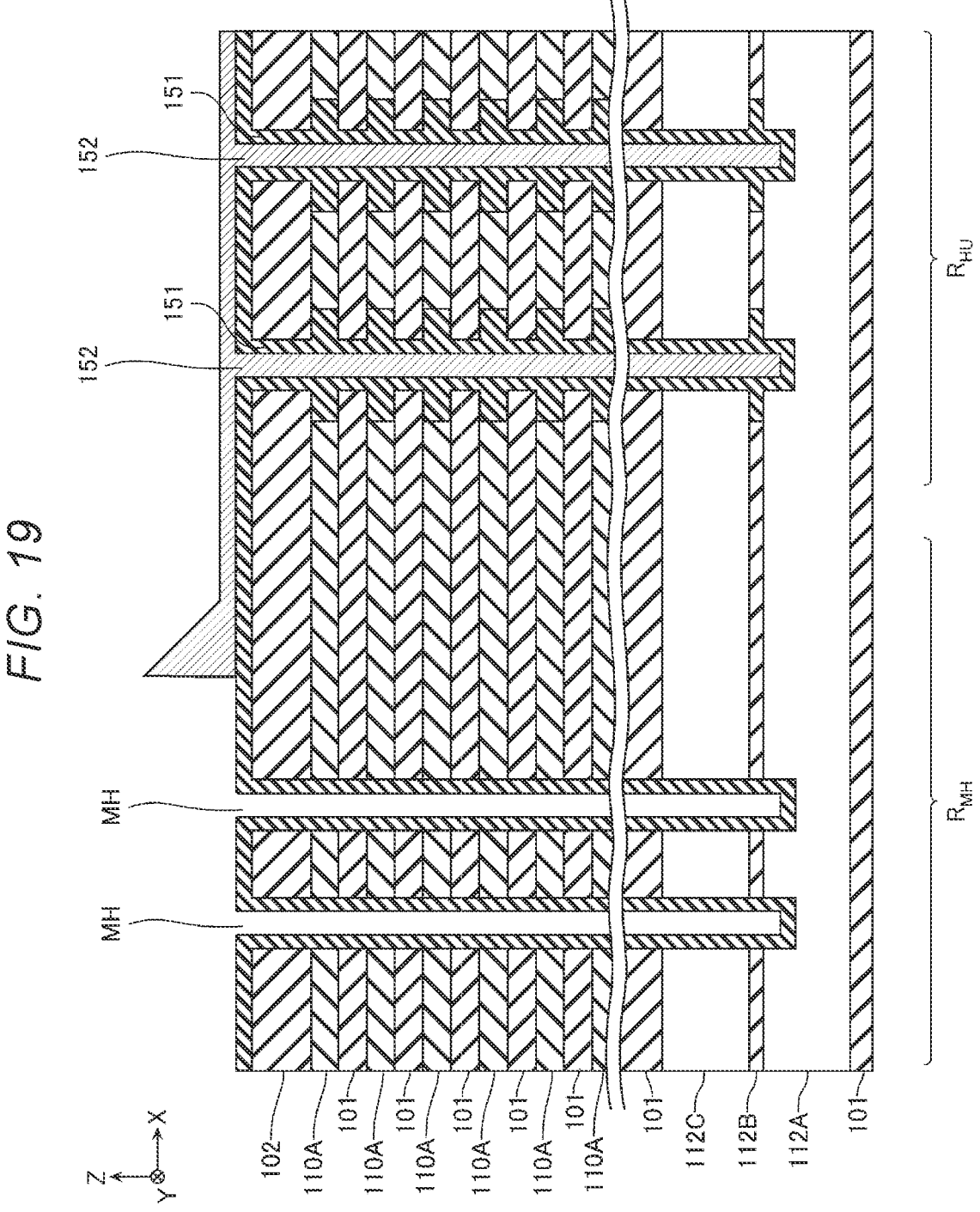
FIG. 19 is a cross-sectional view schematically illustrating the manufacturing method.

Then, for example, as illustrated in FIG. 19, the mask materials 162 and 163 are removed.

Figure 20:
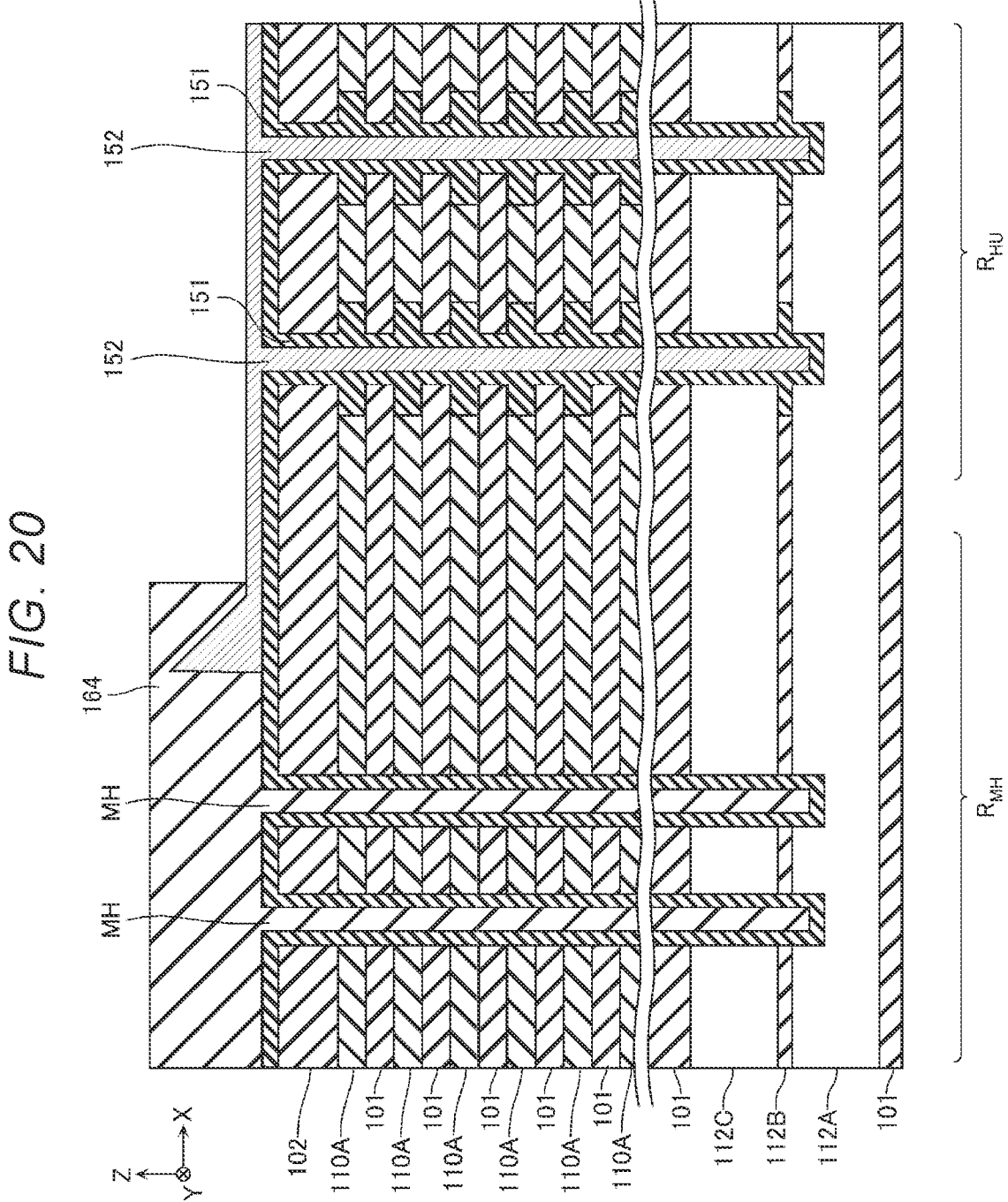
FIG. 20 is a cross-sectional view schematically illustrating the manufacturing method.

Then, for example, as illustrated in FIG. 20, a resist 164 is formed. In this step, the resist 164 is buried in the memory hole MH.

Figure 21:
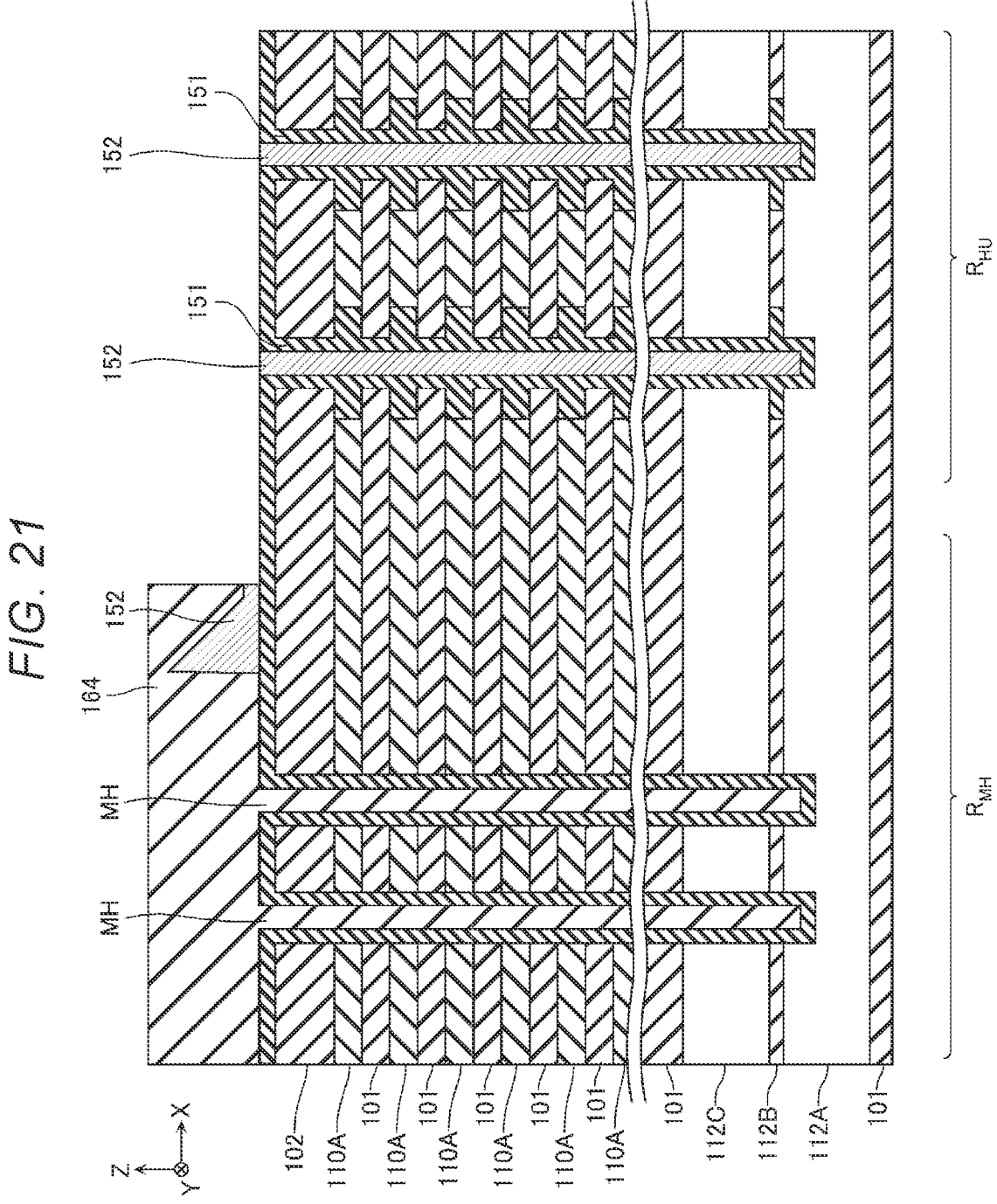
FIG. 21 is a cross-sectional view schematically illustrating the manufacturing method.

Then, for example, as illustrated in FIG. 21, a portion of the insulating layer 152 is removed in the hookup region $R_{HU}$. This step is performed, for example, by RIE. Thus, the support structure HR is formed.

Figure 22:
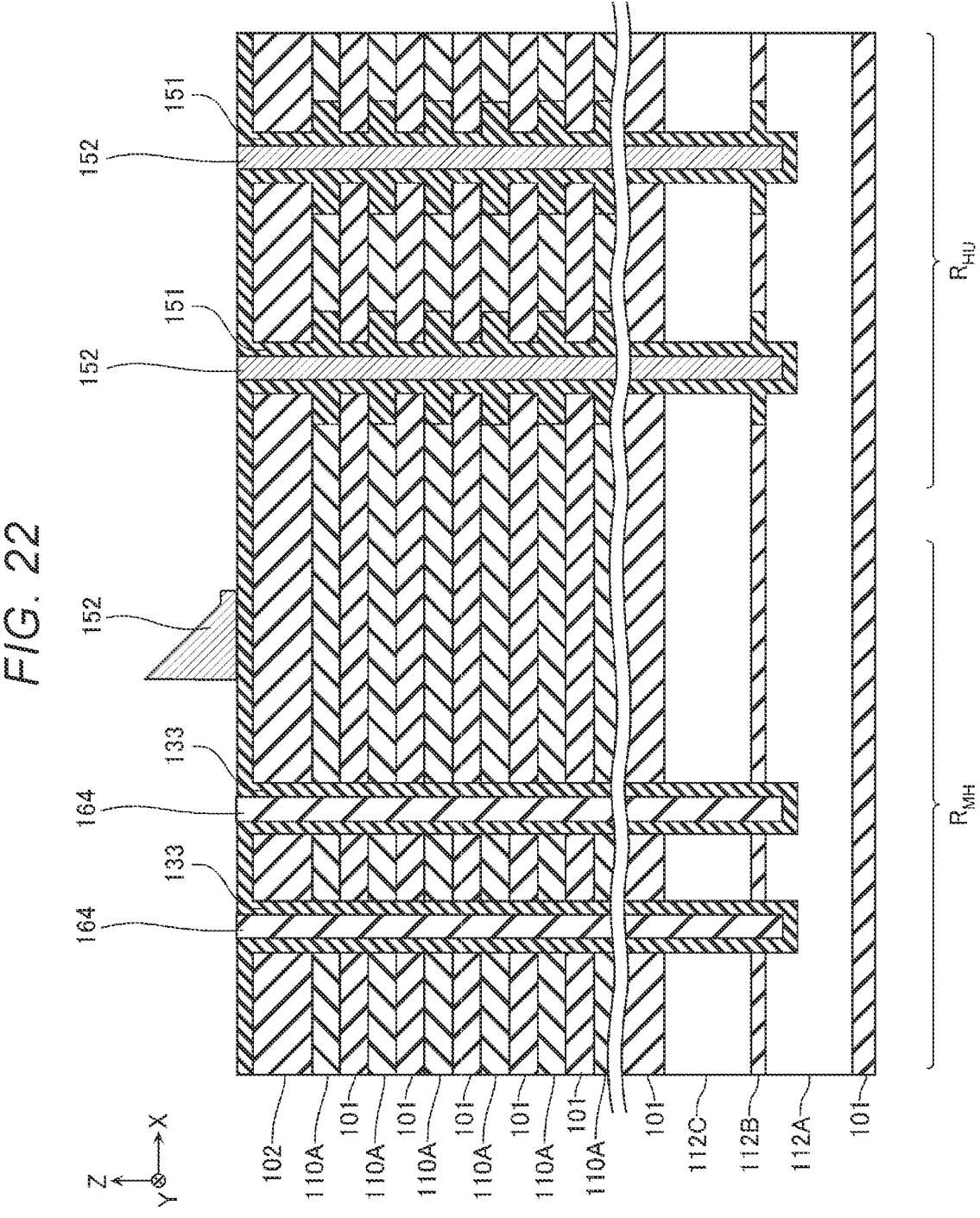
FIG. 22 is a cross-sectional view schematically illustrating the manufacturing method.

Then, for example, as illustrated in FIG. 22, a portion of the resist 164 is removed to expose the upper surface of the block insulating film 133.

Figure 23:
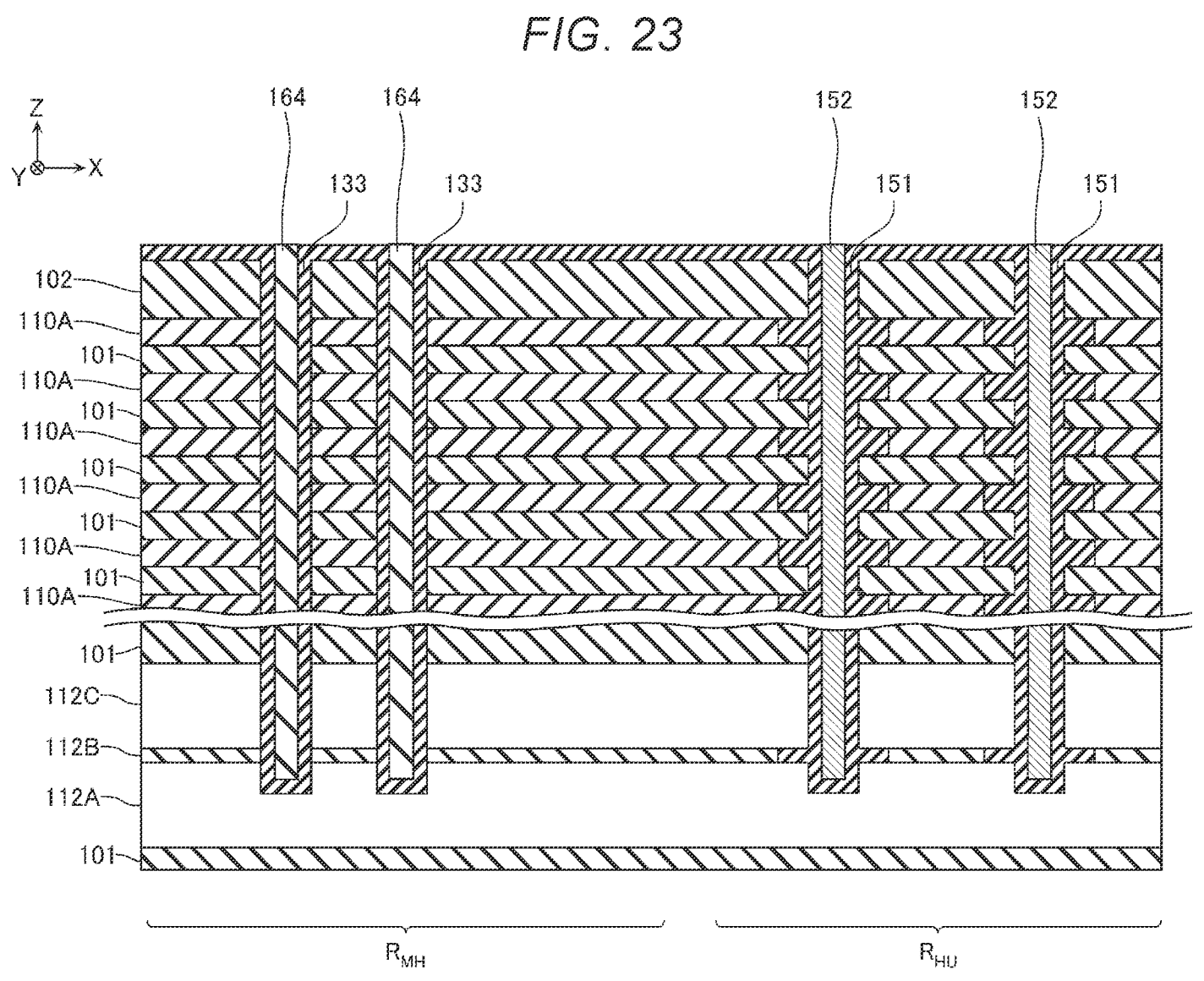

Then, for example, as illustrated in FIG. 23, a portion of the insulating layer 152, which is provided above the insulating layer 102, is removed. This step is performed by, for example, chemical mechanical polishing (CMP).

Figure 24:
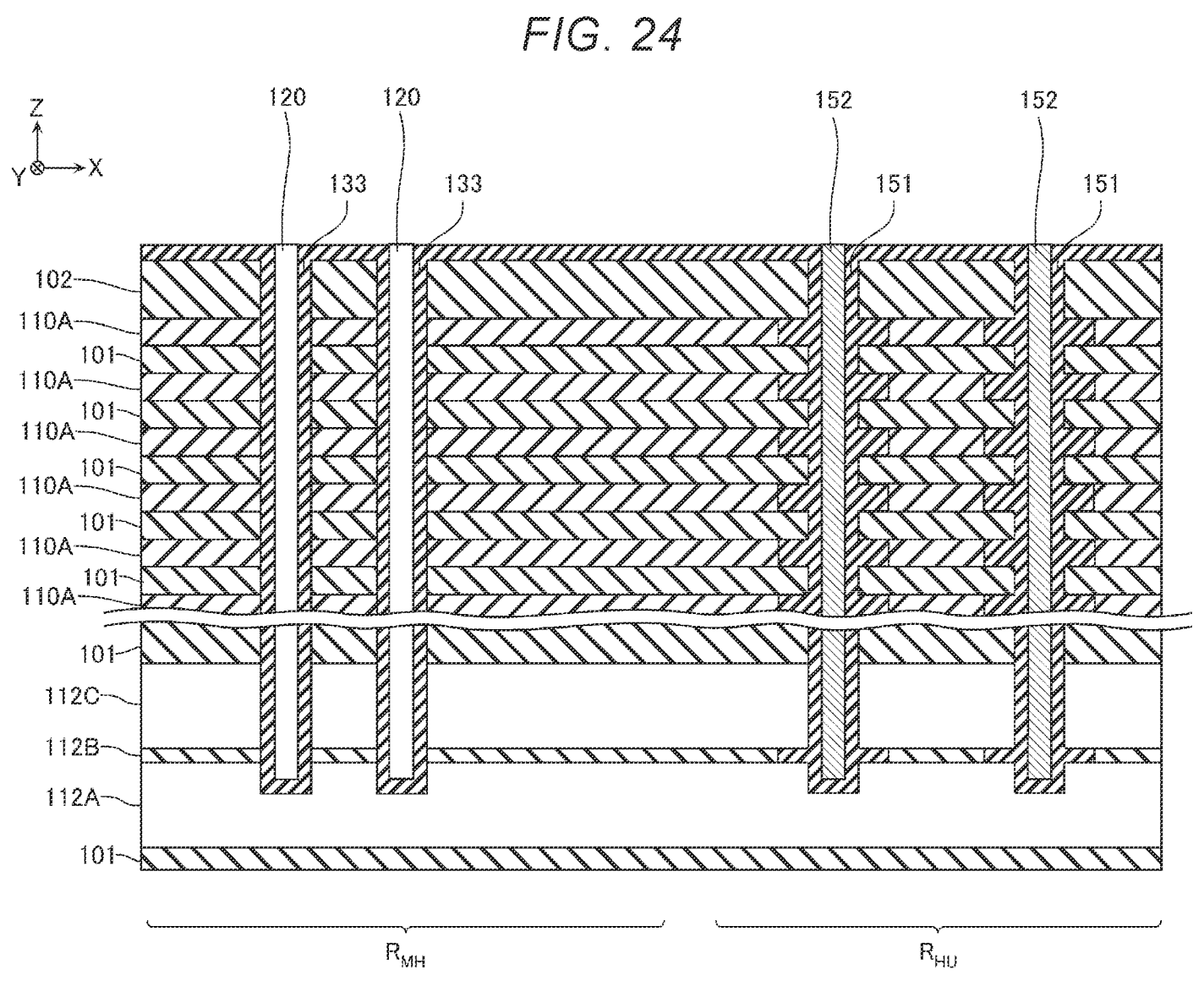

Then, for example, as illustrated in FIG. 24, the semiconductor layer 120 and the like are formed. In this step, for example, first, the resist 164 in the memory hole MH is removed. Then, the charge storage film 132, the tunnel insulating film 131, the semiconductor layer 120, and the insulating layer 125, which have been described with reference to FIG. 2, are formed in the memory hole MH. This step is performed by, for example, CVD.

Figure 25:
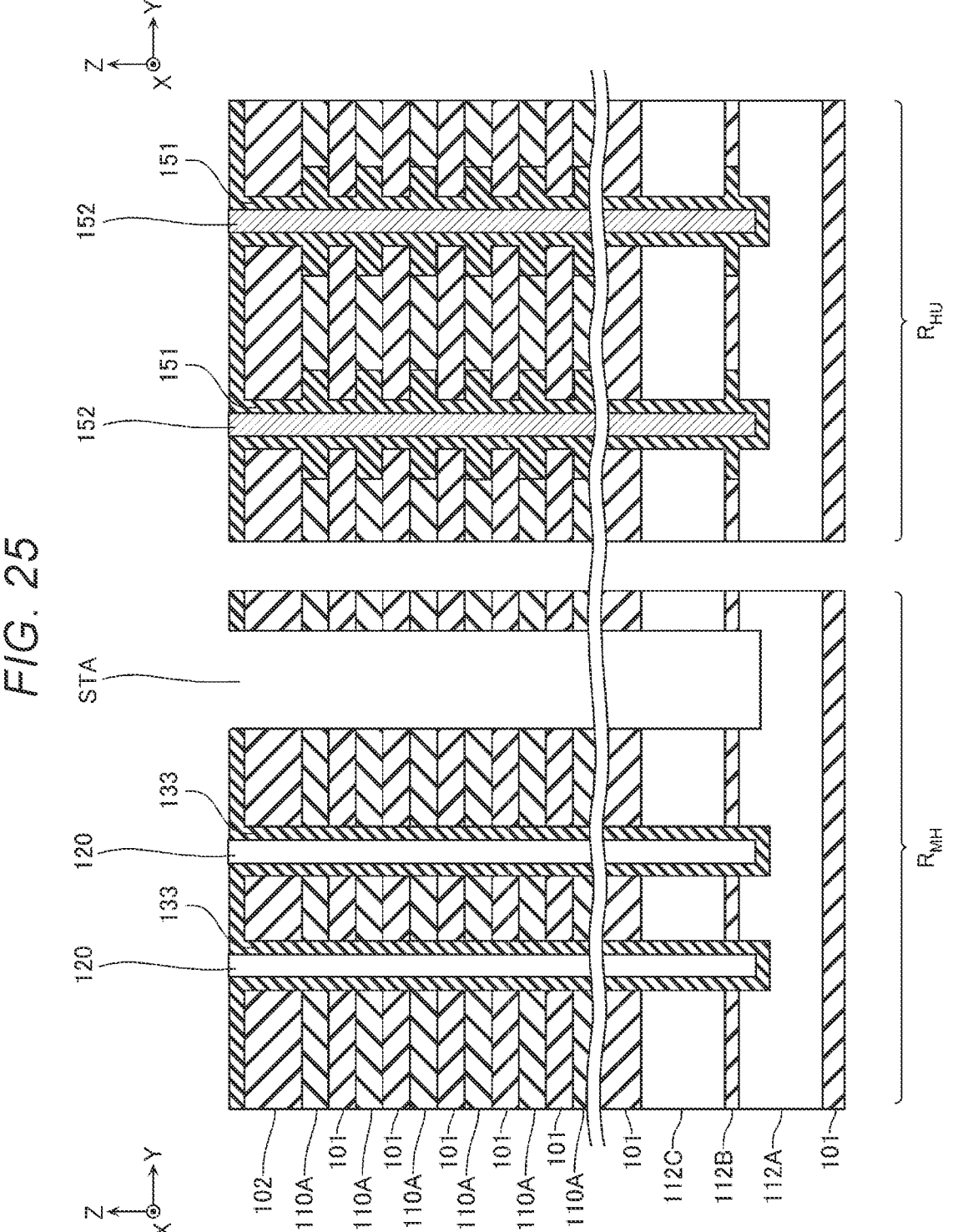
FIG. 25 is a cross-sectional view schematically illustrating the manufacturing method.

Then, as illustrated in FIG. 25, for example, a groove STA is formed. The groove STA is a groove that extends in the Z direction and the X direction, and divides the inter-layer insulating layer 101, the sacrificial layer 110A, the semiconductor layer 112C, and the sacrificial layer 112B in the Y direction to expose the upper surface of the semiconductor layer 112A. This step is performed by, for example, a method such as RIE.

Figure 26:
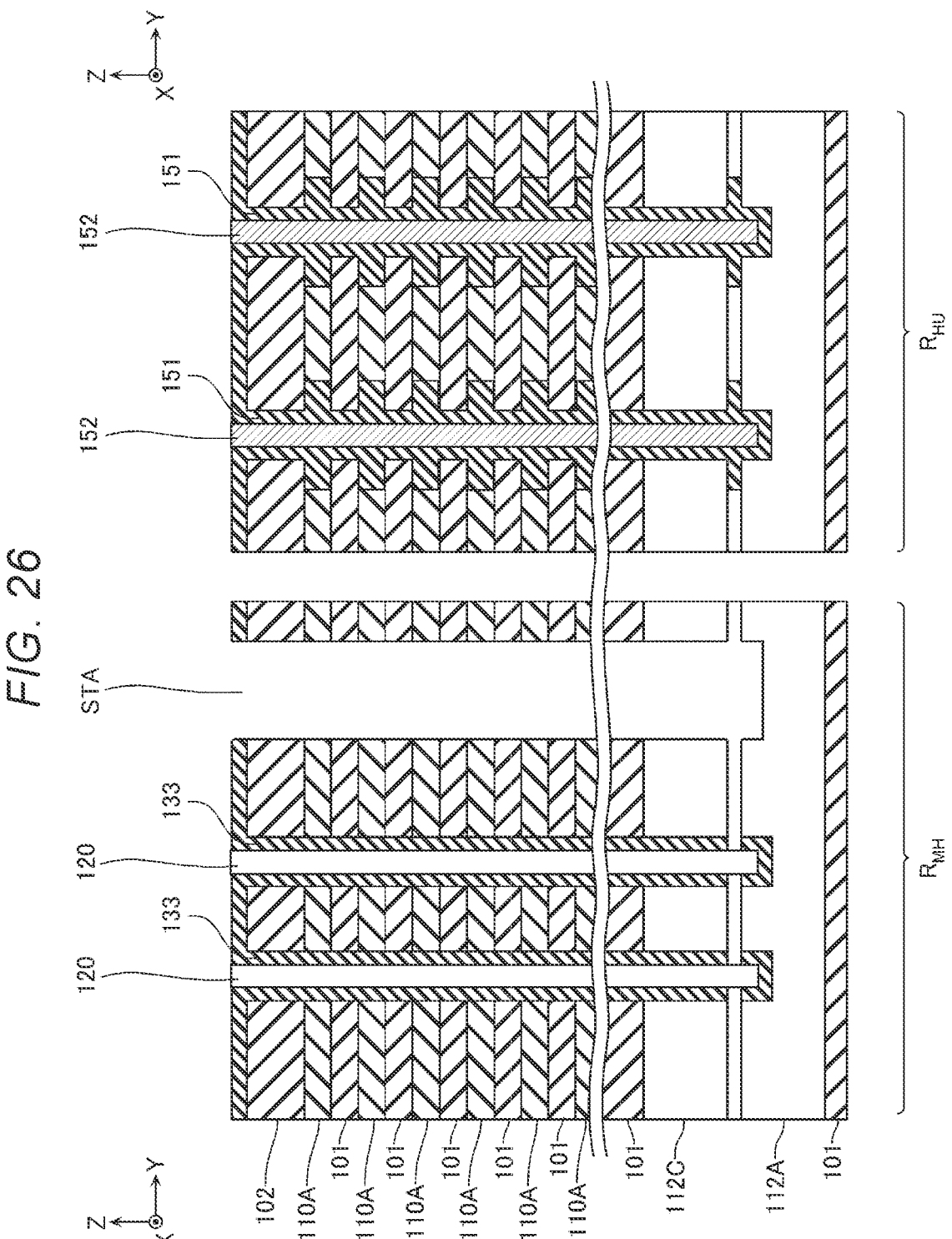
FIG. 26 is a cross-sectional view schematically illustrating the manufacturing method.

Then, for example, as illustrated in FIG. 26, the sacrificial layer 112B and a portion of the gate insulating film 130 are removed to expose a portion of the semiconductor layer 120. This step is performed by, for example, a method such as wet etching.

Figure 27:
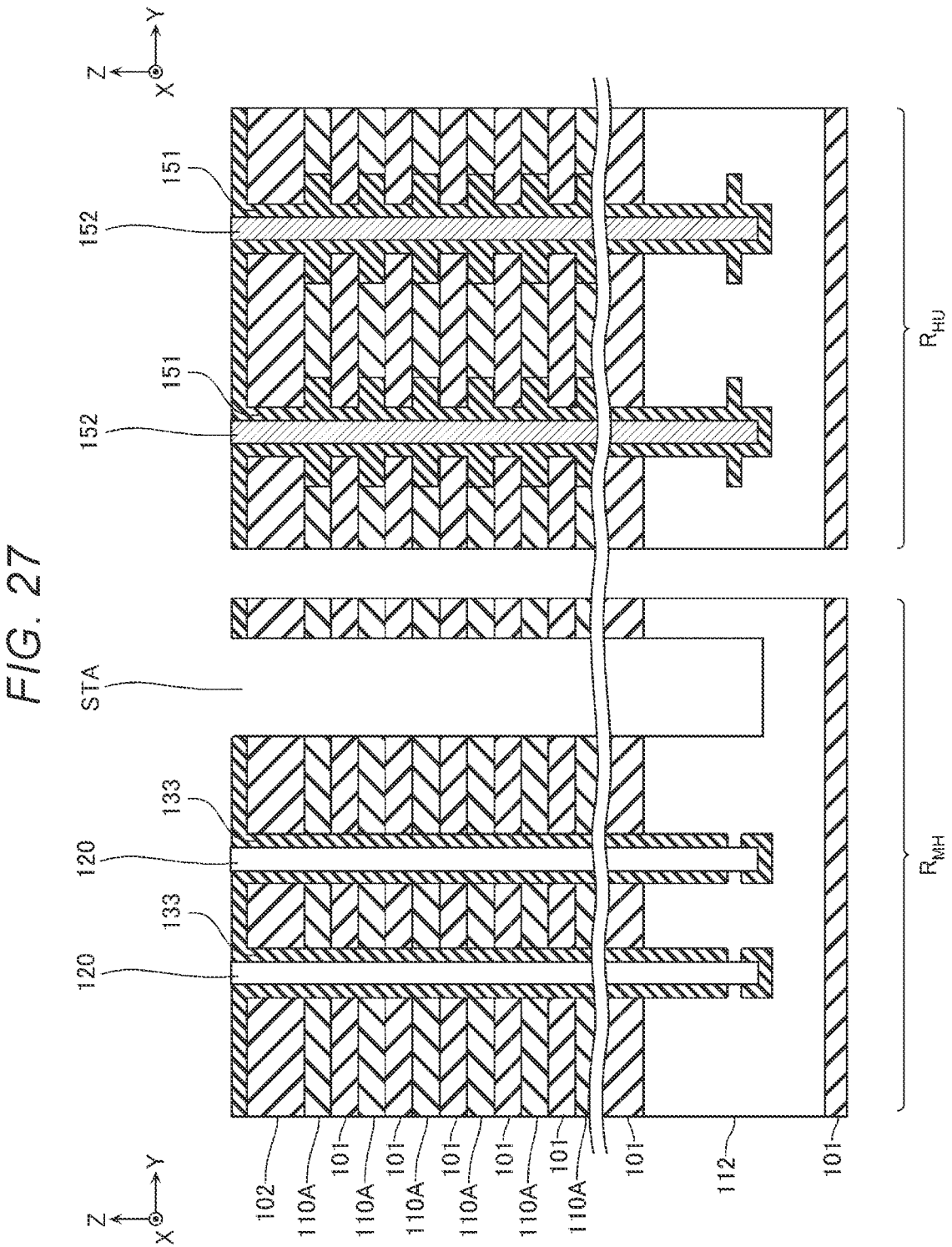
FIG. 27 is a cross-sectional view schematically illustrating the manufacturing method.

Then, for example, as illustrated in FIG. 27, a conductive layer 112 is formed. This step is performed by, for example, a method such as epitaxial growth.

Figure 28:
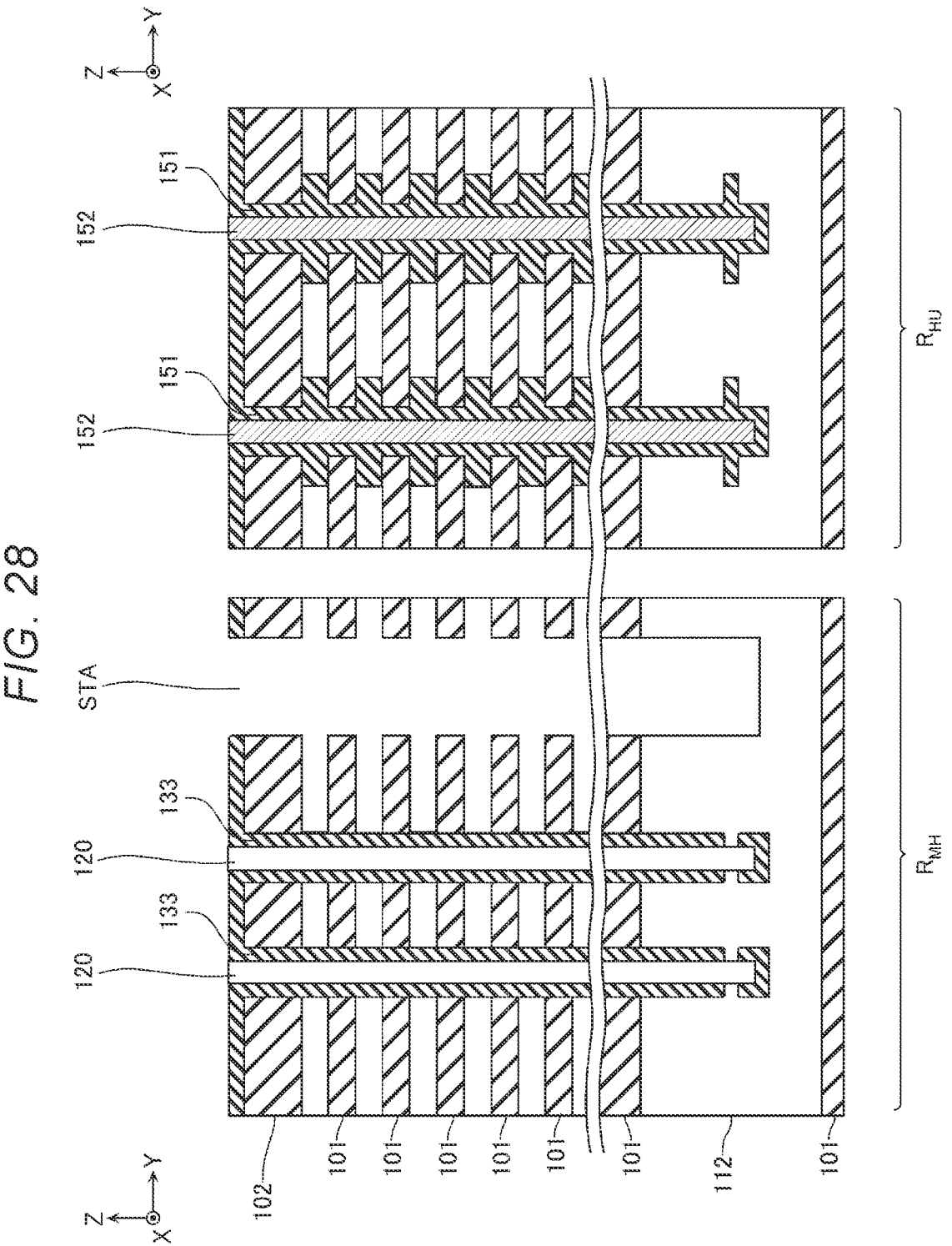
FIG. 28 is a cross-sectional view schematically illustrating the manufacturing method.

Then, as illustrated in FIG. 28, for example, the sacrificial layer 110A is removed through the groove STA. Thus, a hollow structure that includes a plurality of inter-layer insulating layers 101 arranged in the Z direction, a structure (semiconductor layer 120, gate insulating film 130, and insulating layer 125) in the memory hole MH, that supports the plurality of inter-layer insulating layers 101, and a support structure HR that supports the plurality of inter-layer insulating layers 101 is formed. This step is performed by, for example, a method such as wet etching.

Figure 29:
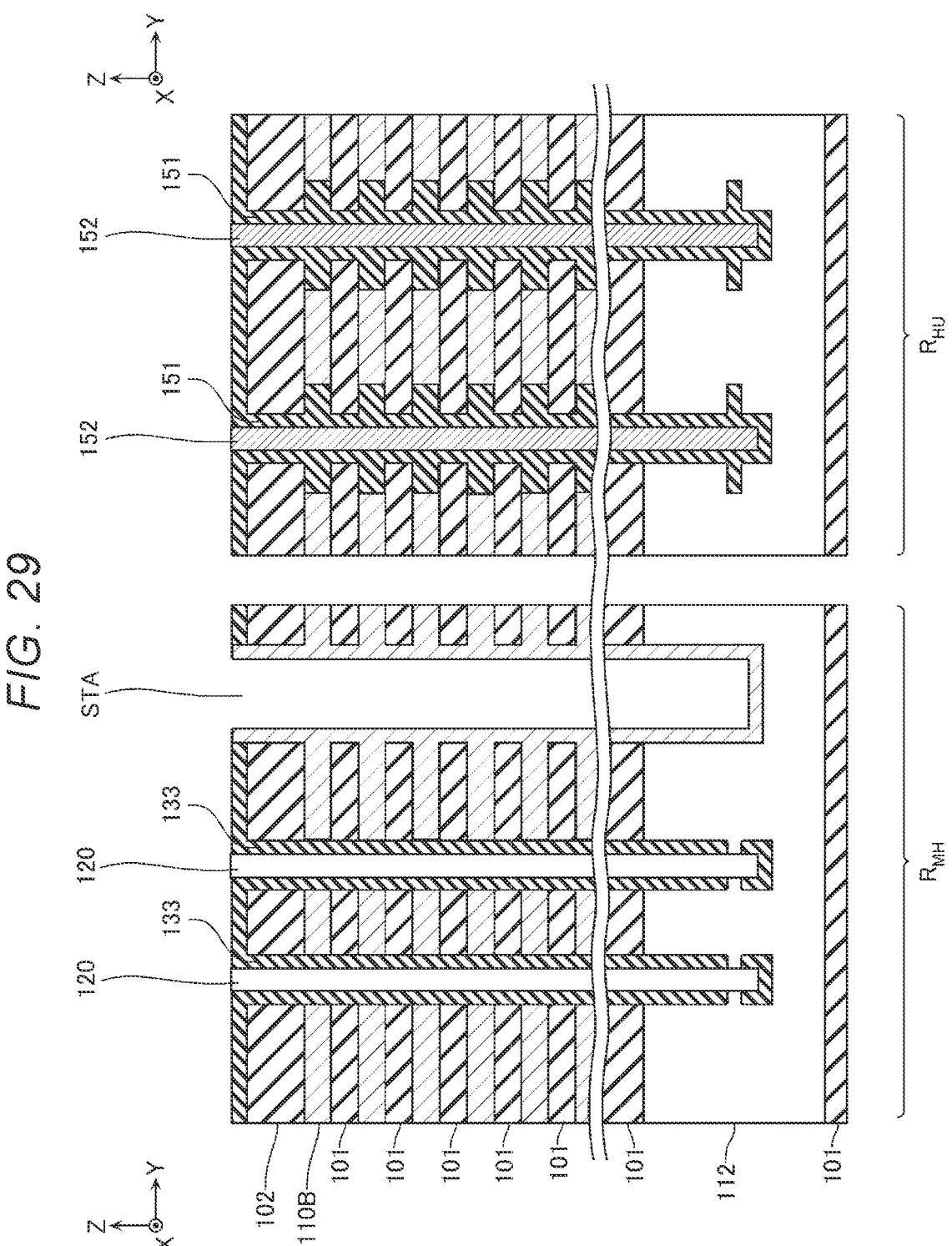
FIG. 29 is a cross-sectional view schematically illustrating the manufacturing method.

Then, for example, as illustrated in FIG. 29, a conductive layer 110B is formed. This step is performed by, for example, a method such as CVD.

Figure 30:
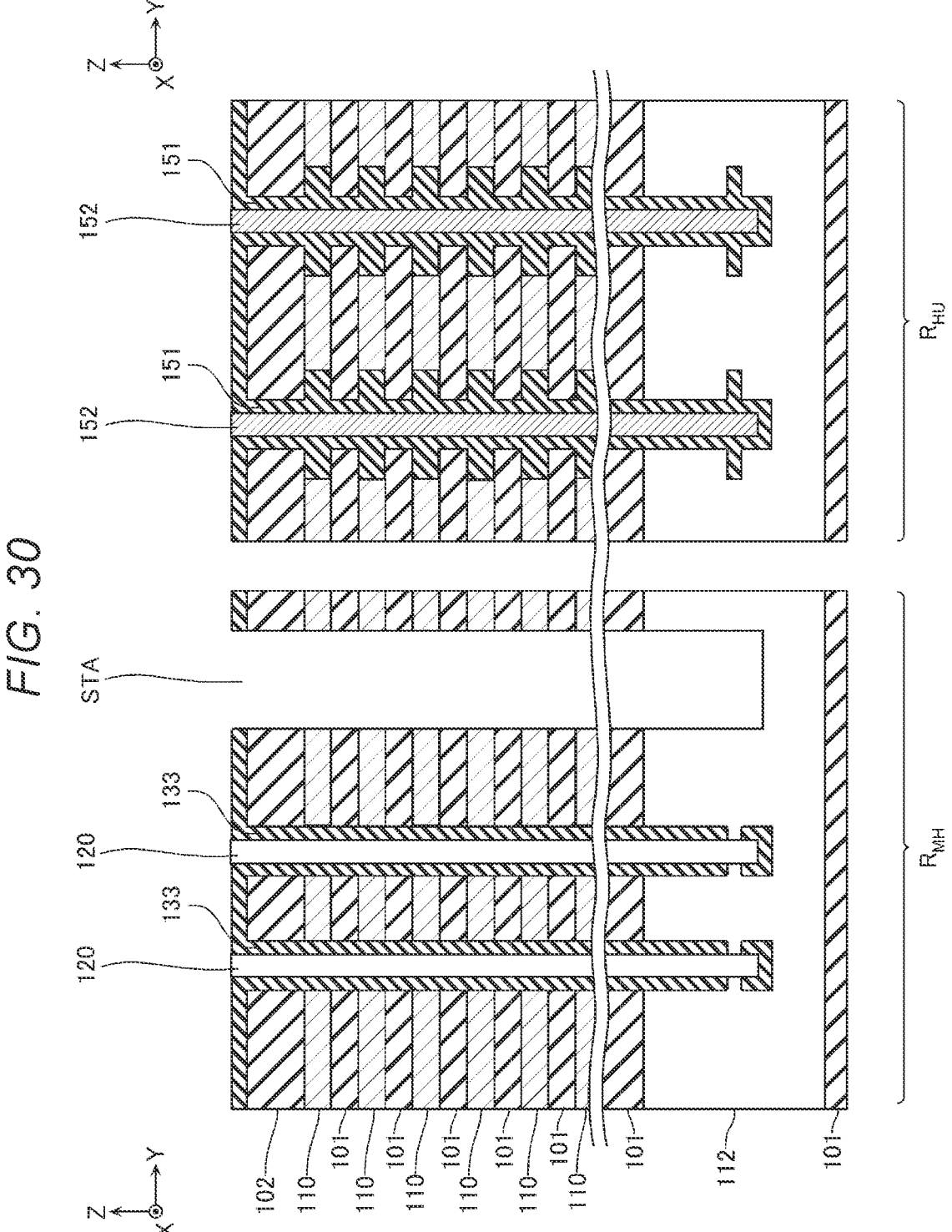
FIG. 30 is a cross-sectional view schematically illustrating the manufacturing method.

Then, for example, as illustrated in FIG. 30, a portion of the conductive layer 110B, which is provided on the side surface of the inter-layer insulating layer 101 in the Y direction is removed. Thus, a plurality of conductive layers 110 arranged in the Z direction are formed.

Then, for example, as illustrated in FIG. 4, an inter-block insulating layer ST is formed in the groove STA. This step is performed by, for example, methods such as CVD and RIE.

After that, a contact electrode CC (FIG. 1), wirings such as a bit line BL (FIG. 1), and the like are formed, and the wafer is divided by dicing. In this manner, the semiconductor storage device according to the embodiment is formed.

Comparative Example

Figure 31:
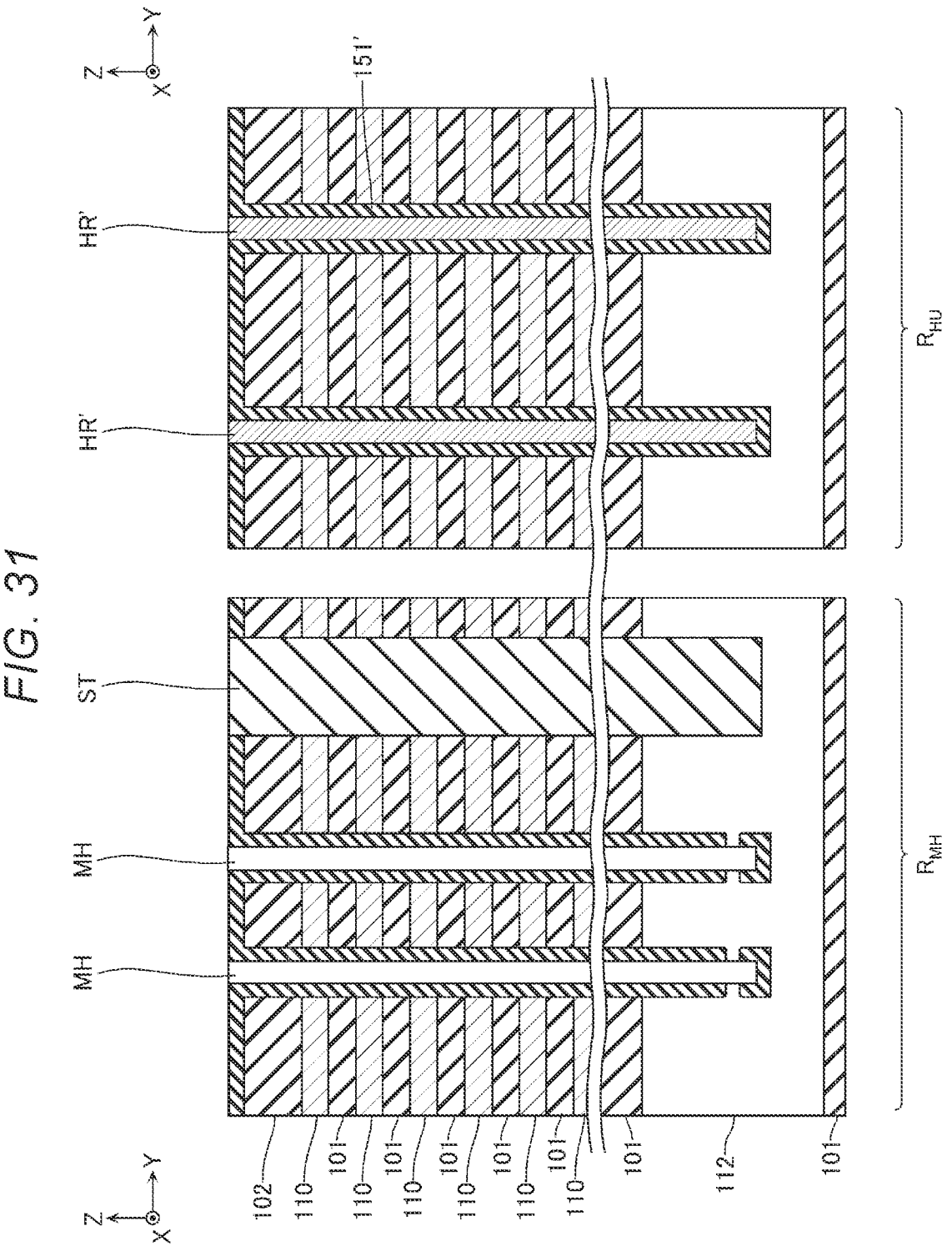
FIG. 31 is a cross-sectional view schematically illustrating a semiconductor storage device according to a comparative example.

FIG. 31 is a cross-sectional view schematically illustrating a semiconductor storage device according to a comparative example. The semiconductor storage device according to the comparative example does not have the support structure HR, but has a support structure HR'. The support structure HR' does not include the insulating layer 151, but includes an insulating layer 151'. As described with reference to FIG. 4, the insulating layer 151 includes two types of regions 153 and 154 having different outer diameters. On the other hand, the insulating layer 151' does not have such a configuration. The outer diameter of the insulating layer 151' is substantially uniform.

Figure 32:
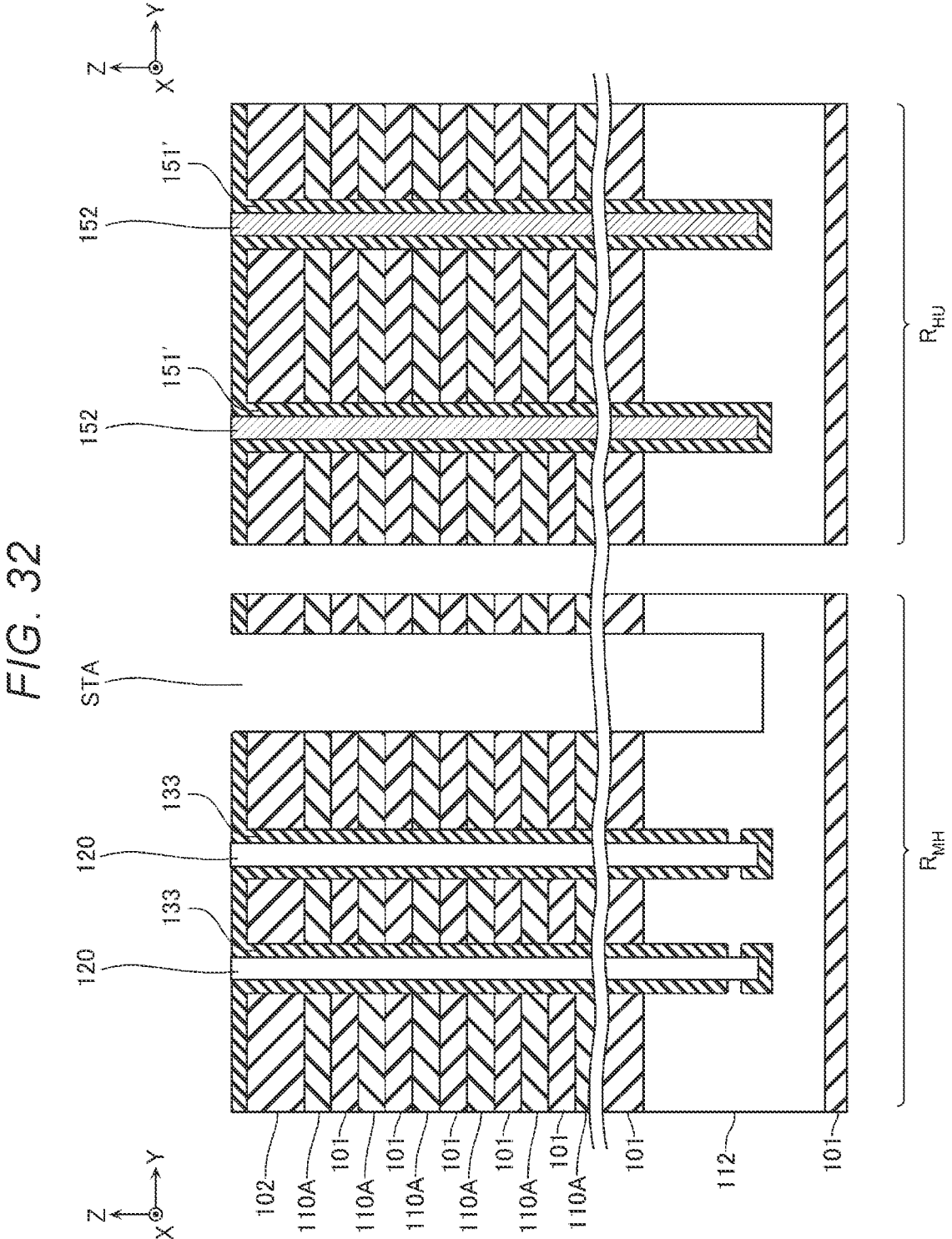
FIG. 32 is a cross-sectional view schematically illustrating a manufacturing method of the semiconductor storage device according to the comparative example.
Figure 33:
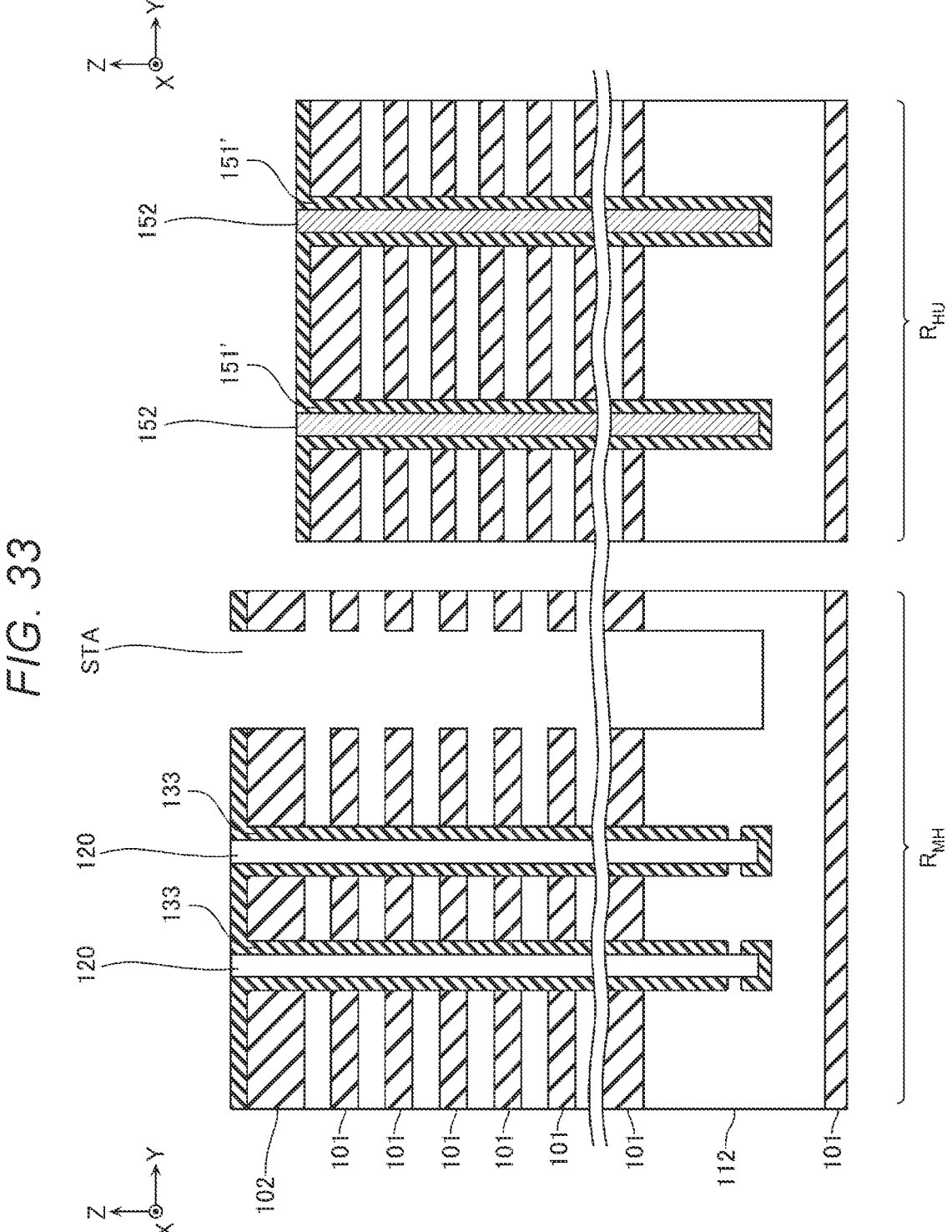
FIG. 33 is a cross-sectional view schematically illustrating the manufacturing method of the semiconductor storage device according to the comparative example.

FIGS. 32 and 33 are cross-sectional views schematically illustrating a manufacturing method of the semiconductor storage device according to the comparative example. FIG. 32 corresponds to the step described with reference to FIG. 27. FIG. 33 corresponds to the step described with reference to FIG. 28.

In manufacturing the semiconductor storage device according to the comparative example, the steps described with reference to FIGS. 8 and 9 are not performed.

As illustrated in FIG. 33, when the plurality of sacrificial layers 110A are removed in manufacturing the semiconductor storage device according to the comparative example, a hollow structure that includes the plurality of inter-layer insulating layers 101 arranged in the Z direction, the structure in the memory hole MH, which supports the plurality of inter-layer insulating layers 101, and the support structure HR' that supports the plurality of inter-layer insulating layers 101 is formed.

Here, the film configuration of the structure (semiconductor layer 120, gate insulating film 130, and insulating layer 125) in the memory hole MH is different from the film configuration of the support structure HR'. In such a case, the amount of heat shrinkage of the structure in the memory hole MH may be different from the amount of heat shrinkage of the support structure HR'. In particular, the amount of heat shrinkage of the insulating layer 152 may be greater than the amount of heat shrinkage of the insulating layer 151. In such a case, when the hollow structure as illustrated in FIG. 33 is formed, the distance between the two inter-layer insulating layers 101 adjacent to each other in the Z direction may fluctuate depending on the amount of heat shrinkage of the structure in the memory hole MH or the support structure HR'. With this, the height position of the upper surface of the structure in the memory hole region $R_{MH}$ may be different from the height position of the upper surface of the structure in the hookup region $R_{HU}$.

Effects

In manufacturing the semiconductor storage device according to the embodiment, the insulating layer 151 is formed in the step described with reference to FIG. 11. The insulating layer 151 includes the plurality of regions 153 arranged in the Z direction. Here, the plurality of regions 153 are buried in a region near the via hole HRH among regions between the plurality of inter-layer insulating layers 101 arranged in the Z direction. Thus, it is possible to prevent the fluctuation of the height position of the upper surface as described above. In particular, when the amount of heat shrinkage of the insulating layer 151 is smaller than the amount of heat shrinkage of the insulating layer 152, it is possible to suitably support the plurality of inter-layer insulating layers 101 by the plurality of regions 153.

Other Embodiments

Hitherto, the semiconductor storage device according to the embodiment has been described. Alternatively, such configurations are merely examples, and the specific configuration can be adjusted as appropriate.

Figure 34:
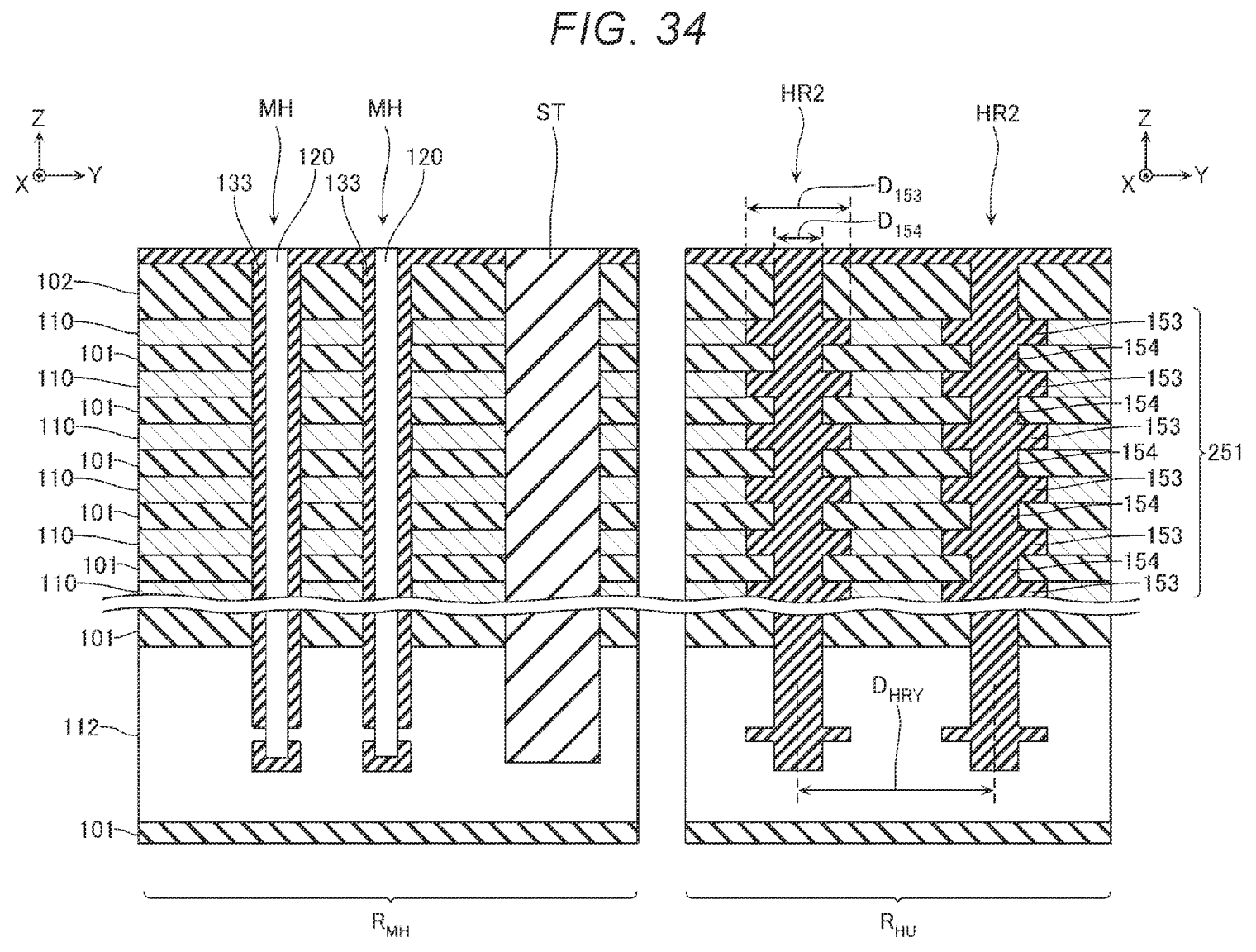

For example, a semiconductor storage device illustrated in FIG. 34 includes a support structure HR2 instead of the support structure HR. The support structure HR2 is basically configured in the similar manner to the support structure HR. The support structure HR2 includes an insulating layer 251 instead of the insulating layers 151 and 152. The insulating layer 251 is basically configured in the similar manner to the insulating layer 151. The insulating layer 251 is buried in via hole HRH (FIG. 8).

Figure 35:
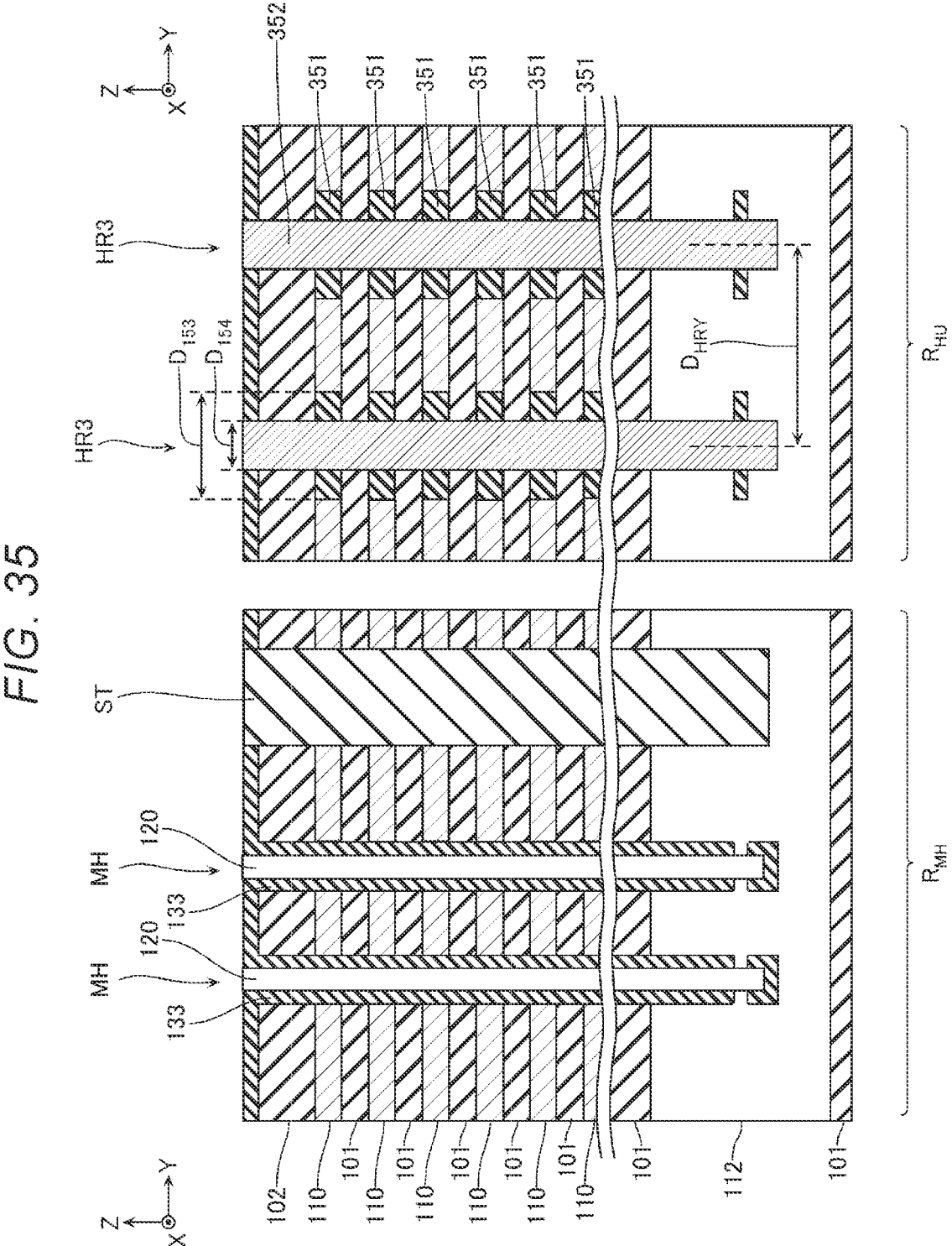
FIG. 35 is a cross-sectional view schematically illustrating a semiconductor storage device according to still another embodiment.

Further, for example, a semiconductor storage device illustrated in FIG. 35 includes a support structure HR3 instead of the support structure HR. The support structure HR3 is basically configured in the similar manner to the support structure HR. The support structure HR3 includes a plurality of insulating layers 351 arranged in the Z direction and an insulating layer 352 extending in the Z direction, instead of the insulating layers 151 and 152. The insulating layer 352 is basically configured in the similar manner to the insulating layer 152. The outer peripheral surface of the insulating layer 352 is in contact with the plurality of insulating layers 351 arranged in the Z direction and the plurality of inter-layer insulating layers 101 arranged in the Z direction. The plurality of insulating layers 351 arranged in the Z direction are configured in the similar manner to the plurality of regions 153 of the insulating layer 151, which are arranged in the Z direction. Such a configuration can be achieved, for example, by forming the mask material 160 (FIG. 8) and then oxidizing the sacrificial layer 110A by an oxidation treatment to form the insulating layer 351. Further, such a configuration can also be achieved by forming the mask material 162 (FIG. 16), and then removing a portion of the insulating layer 151.

In the above example, an example in which the support structures HR, HR2, and HR3 are provided in the hookup region $R_{HU}$ has been described. Alternatively, the support structures HR, HR2, and HR3 may be provided in a region other than the hookup region $R_{HU}$.

Others

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
a substrate including a first region and a second region arranged in a first direction;
a plurality of conductive layers and a plurality of inter-layer insulating layers alternately arranged in a second direction intersecting a surface of the substrate, wherein the plurality of conductive layers and the plurality of inter-layer insulating layers each extend in the first direction over the first region and the second region;
a semiconductor layer provided in the first region, extending in the second direction, and facing the plurality of conductive layers;
a charge storage film provided between the plurality of conductive layers and the semiconductor layer; a first structure provided in the second region and extending in the second direction; and
a second insulating layer provided in the second region, extending in the second direction, and includes an outer surface surrounded by the first insulating layer,
wherein the first structure includes:

a plurality of third regions provided at first positions corresponding to at least some of the plurality of conductive layers, respectively, and a plurality of fourth regions provided at second positions corresponding to at least some of the plurality of inter-layer insulating layers, respectively, and a first width of the plurality of third regions in the first direction is greater than a second width of the plurality of fourth regions in the first direction, wherein the first structure includes a first insulating layer including at least one of the plurality of third regions, the first insulating layer has at least one of: a density higher than a density of at least one of the plurality of inter-layer insulating layers, a hydrogen content smaller than a hydrogen content of at least one of the plurality of inter-layer insulating layers, or an etching rate for a first chemical solution smaller than an etching rate for the first chemical solution of at least one of the plurality of inter-layer insulating layers, and the first insulating layer has at least one of a density higher than a density of the second insulating layer, a hydrogen content smaller than a hydrogen content of the second insulating layer, or an etching rate for a second chemical solution is smaller than an etching rate for the second chemical solution of the second insulating layer.

2. The semiconductor storage device according to claim 1, further comprising:

a second structure provided in the second region and extending in the second direction, wherein a first protrusion amount is greater than $1\frac{1}{16}$ of a first distance, and wherein the first distance is equal to a distance between a central position of the first structure and a central position of the second structure in the first direction, and the first protrusion amount is equal to a half of a difference between the first width and the second width.

3. The semiconductor storage device according to claim 1, further comprising:

a contact electrode provided in the second region, extending in the second direction, and connected to one of the plurality of conductive layers.

4. The semiconductor storage device according to claim 1, wherein the first chemical solution includes hydrofluoric acid.

5. The semiconductor storage device according to claim 1, wherein the second chemical solution includes hydrofluoric acid.

* * * * *